(12) United States Patent
Kim et al.

(10) Patent No.: US 10,720,103 B2
(45) Date of Patent: *Jul. 21, 2020

(54) DISPLAY DEVICE AND DRIVING METHOD THEREOF

(71) Applicant: Samsung Display Co., Ltd., Yongin-Si, Gyeonggi-Do (KR)

(72) Inventors: Chang Yeop Kim, Yongin-si (KR); Jin Jeon, Yongin-si (KR)

(73) Assignee: Samsung Display Co., Ltd. (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/503,710

(22) Filed: Jul. 5, 2019

(65) Prior Publication Data
US 2019/0333448 A1 Oct. 31, 2019

Related U.S. Application Data

(63) Continuation of application No. 15/586,402, filed on May 4, 2017, now Pat. No. 10,347,179.

(30) Foreign Application Priority Data

Aug. 23, 2016 (KR) ........................ 10-2016-0107059

(51) Int. Cl.
*G09G 3/32* (2016.01)
*G09G 3/3233* (2016.01)
(Continued)

(52) U.S. Cl.
CPC ......... *G09G 3/3233* (2013.01); *G09G 3/3225* (2013.01); *G09G 3/3266* (2013.01);
(Continued)

(58) Field of Classification Search
CPC ....... G09G 2300/0426; G09G 2310/08; G09G 2320/0233; G09G 2320/0261;
(Continued)

(56) References Cited

U.S. PATENT DOCUMENTS 1,724,356 A * 8/1929 Lambert ............. A47J 43/1087
366/129
3,810,484 A * 5/1974 Martini ................... F16K 13/06
137/70
(Continued)

FOREIGN PATENT DOCUMENTS

KR 10-2016-0074761 A 6/2016

OTHER PUBLICATIONS

European Search Report corresponding to EP Application No. 17181598.8 dated Jan. 24, 2018, 8 pages.

*Primary Examiner* — Tony O Davis
(74) *Attorney, Agent, or Firm* — Innovation Counsel LLP

(57) ABSTRACT

The present disclosure relates to a display device whose image quality is improved.
A display device according to an embodiment of the present disclosure includes a first display area configured to include a plurality of first pixels which are disposed at least one horizontal line; a second display area configured to include a plurality of second pixels which are disposed in a plurality of horizontal lines; and an infrared (IR) light source configured to overlap the first display area in a plan view. The plurality of first pixels are set to be in a non-emission state during a period when the IR light source is driven.

46 Claims, 28 Drawing Sheets

(51) Int. Cl.
*G09G 3/3225* (2016.01)
*G09G 3/3266* (2016.01)
*G09G 3/3275* (2016.01)
*H01L 27/32* (2006.01)

(52) U.S. Cl.
CPC ....... *G09G 3/3275* (2013.01); *H01L 27/3248* (2013.01); *G09G 2300/0426* (2013.01); *G09G 2310/08* (2013.01); *G09G 2320/0233* (2013.01); *G09G 2320/0261* (2013.01); *G09G 2320/0646* (2013.01); *G09G 2330/021* (2013.01); *G09G 2360/145* (2013.01)

(58) Field of Classification Search
CPC ..... G09G 2320/0646; G09G 2330/021; G09G 2360/145; G09G 3/3225; G09G 3/3233; G09G 3/3266; G09G 3/3275; H01L 27/3248
USPC .......................................... 345/156, 170–178
See application file for complete search history.

(56) References Cited

U.S. PATENT DOCUMENTS

| | | | |
|---|---|---|---|
| 4,724,356 A | 2/1988 | Daehler | |
| 8,810,484 B2 | 8/2014 | Kim | |
| 10,347,179 B2* | 7/2019 | Kim | G09G 3/3225 |
| 2007/0018915 A1* | 1/2007 | Tang | G09G 3/3225 |
| | | | 345/76 |
| 2008/0297487 A1* | 12/2008 | Hotelling | G06F 1/3203 |
| | | | 345/173 |
| 2011/0018893 A1* | 1/2011 | Kim | G06F 3/0412 |
| | | | 345/589 |
| 2011/0043487 A1* | 2/2011 | Huang | G06F 3/0412 |
| | | | 345/175 |
| 2011/0063266 A1* | 3/2011 | Chung | G09G 3/3233 |
| | | | 345/205 |
| 2011/0202310 A1* | 8/2011 | Min | G01S 17/10 |
| | | | 702/166 |
| 2011/0271216 A1* | 11/2011 | Wilson | G06F 3/0481 |
| | | | 715/765 |
| 2011/0279437 A1* | 11/2011 | Komiya | G09G 3/3233 |
| | | | 345/212 |
| 2012/0086647 A1* | 4/2012 | Birkler | G06F 1/3203 |
| | | | 345/173 |
| 2012/0313912 A1* | 12/2012 | Kanbayashi | G02F 1/13318 |
| | | | 345/207 |
| 2013/0230074 A1* | 9/2013 | Shin | G01J 5/0025 |
| | | | 374/129 |
| 2014/0022629 A1* | 1/2014 | Powell | G06K 19/0614 |
| | | | 359/350 |
| 2014/0062882 A1* | 3/2014 | Ozawa | G06F 3/038 |
| | | | 345/158 |
| 2014/0092052 A1* | 4/2014 | Grunthaner | G06F 3/044 |
| | | | 345/174 |
| 2014/0132530 A1* | 5/2014 | Suh | G06F 3/0412 |
| | | | 345/173 |
| 2014/0218327 A1* | 8/2014 | Shi | G06F 3/041 |
| | | | 345/174 |
| 2014/0240492 A1* | 8/2014 | Lee | H04N 5/2256 |
| | | | 348/136 |
| 2014/0267171 A1* | 9/2014 | Kim | G06F 3/0421 |
| | | | 345/175 |
| 2014/0354597 A1 | 12/2014 | Kitchens, II et al. | |
| 2014/0354905 A1* | 12/2014 | Kitchens | G06F 1/3215 |
| | | | 349/12 |
| 2015/0034911 A1* | 2/2015 | Liu | H01L 31/053 |
| | | | 257/40 |
| 2015/0179726 A1* | 6/2015 | Liu | H01L 51/0089 |
| | | | 257/40 |
| 2015/0181099 A1* | 6/2015 | Van Der Tempel | |
| | | | G01S 17/023 |
| | | | 348/135 |
| 2015/0243712 A1* | 8/2015 | Wang | H01L 27/3227 |
| | | | 257/40 |
| 2015/0348504 A1* | 12/2015 | Sakariya | G09G 3/3233 |
| | | | 345/206 |
| 2015/0364107 A1* | 12/2015 | Sakariya | G06F 3/0412 |
| | | | 345/174 |
| 2016/0004910 A1* | 1/2016 | Khachaturian | A61B 5/742 |
| | | | 348/77 |
| 2016/0110025 A1* | 4/2016 | Hossu | G06F 3/0412 |
| | | | 382/124 |
| 2016/0170700 A1* | 6/2016 | Olmo | G06F 3/0481 |
| | | | 345/1.1 |
| 2016/0180766 A1* | 6/2016 | Kim | G09G 3/30 |
| | | | 345/211 |
| 2016/0210473 A1* | 7/2016 | Cohen | G06F 3/013 |
| 2017/0064291 A1* | 3/2017 | Do | G09G 3/2003 |
| 2017/0105633 A1* | 4/2017 | Shin | A61B 5/02007 |
| 2017/0123542 A1* | 5/2017 | Xie | H01L 21/77 |
| 2017/0228125 A1* | 8/2017 | Lee | G06F 3/0421 |
| 2017/0242549 A1* | 8/2017 | Lim | G06F 3/0412 |
| 2017/0263828 A1* | 9/2017 | Mao | H01L 33/62 |
| 2017/0337413 A1* | 11/2017 | Bhat | G06K 9/0002 |
| 2018/0018917 A1* | 1/2018 | Yoo | G09G 3/3266 |
| 2018/0061315 A1* | 3/2018 | Kim | G09G 3/3225 |
| 2018/0101271 A1* | 4/2018 | Tsai | G06F 3/0412 |
| 2019/0115415 A1* | 4/2019 | Choi | H01L 27/3276 |
| 2019/0148439 A1* | 5/2019 | Shin | H01L 27/1463 |
| | | | 257/443 |

\* cited by examiner

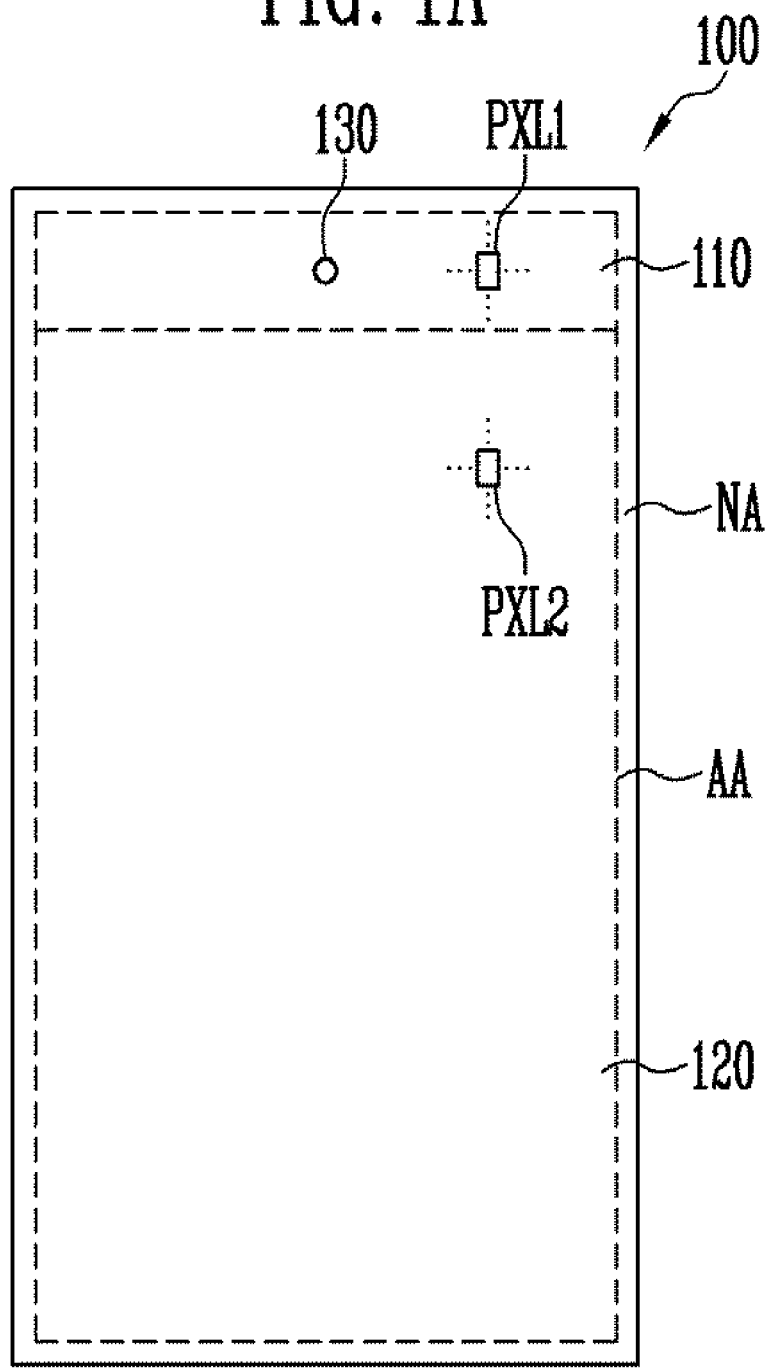

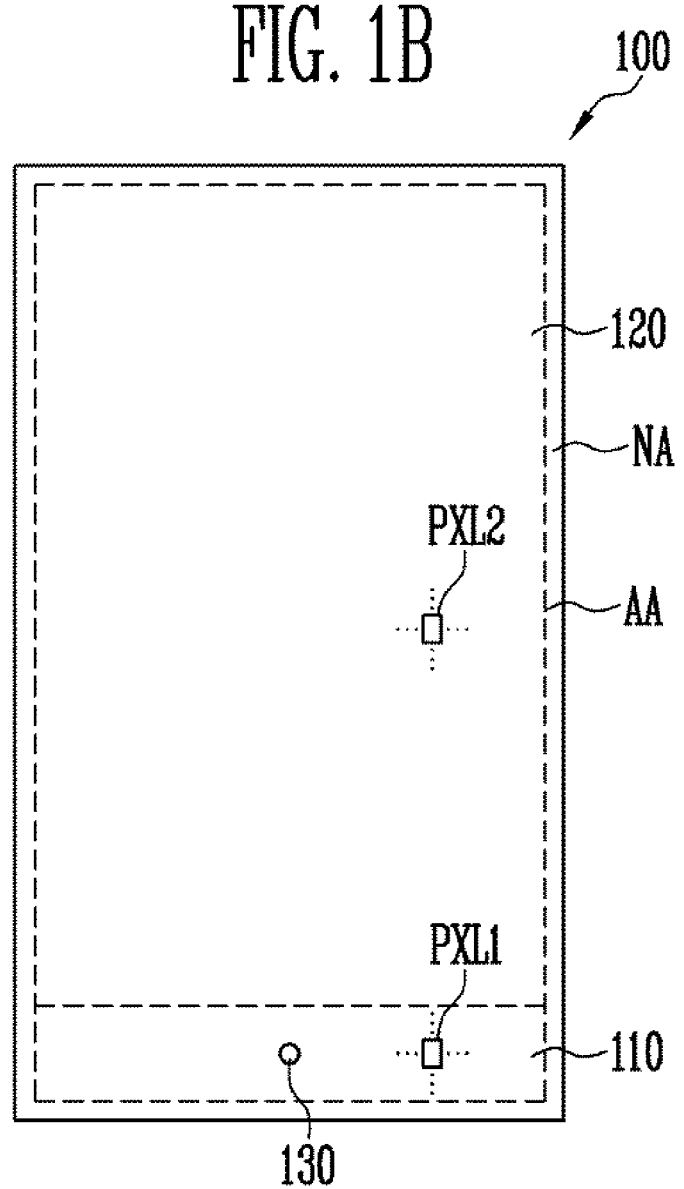

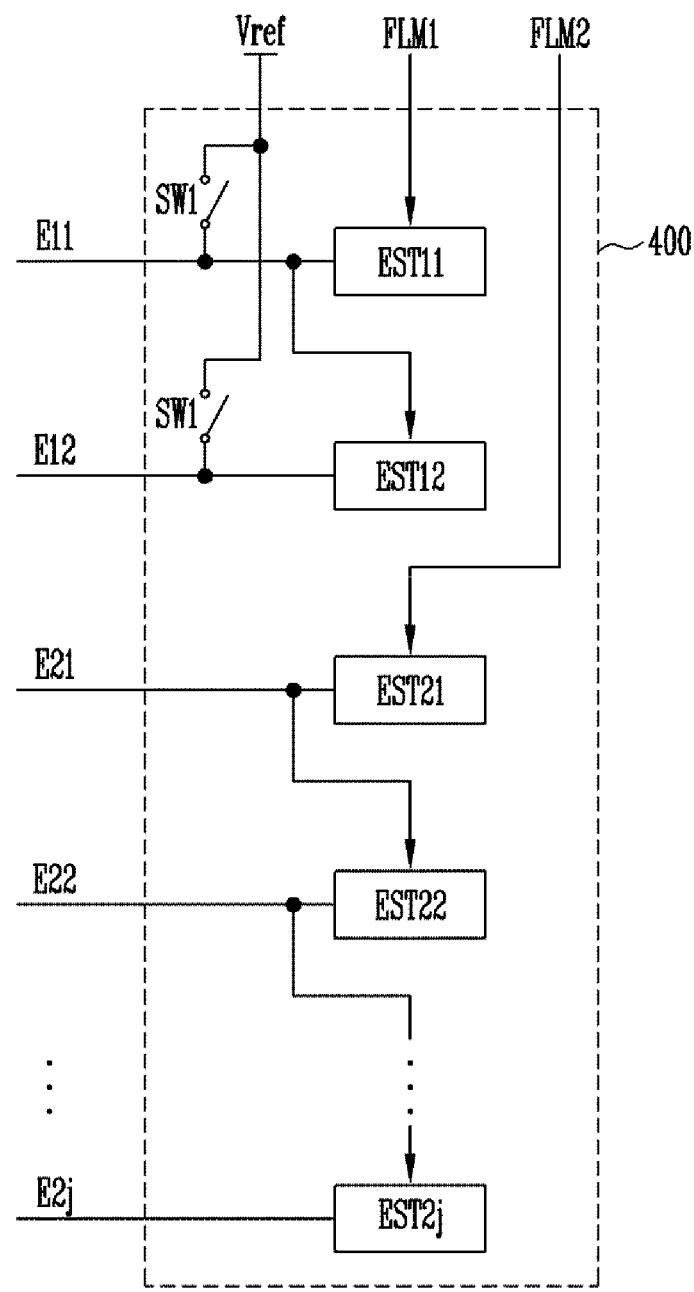

DISPLAY DEVICE AND DRIVING METHOD THEREOF

CROSS-REFERENCE TO RELATED APPLICATION

This application is a continuation application of U.S. patent application Ser. No. 15/586,402 filed on May 4, 2017, which claims priority under 35 USC § 119 to Korean Patent Application No. 10-2016-0107059, filed on Aug. 23, 2016, in the Korean Intellectual Property Office, the entire contents of which are incorporated herein by reference in their entirety.

BACKGROUND

1. Technical Field

The present disclosure relates to a display device and a driving method thereof, and particularly to a display device whose image quality is improved and a driving method thereof.

2. Related Art

As information technology develops, importance of a display device that is a medium which connects a user to information is highlighted. According to this, the display device such as a liquid crystal display device or an organic light emitting display device is increasingly used.

The organic light emitting display device which is one of the display device includes an organic light emitting diode that is a self-luminous element. The organic light emitting display device may realize high luminance with low power consumption, thereby, being generally used in a portable device.

Meanwhile, various methods are studied to reduce a dead space of the portable device. As an example, a method of disposing various sensors which are used for the portable device in a pixel area in which an image is displayed is studied. However, if the sensors are disposed in the display area, pixels can be recognized as a bright pixel having a higher brightness than the pixels adjacent to the first pixel.

SUMMARY

The present disclosure provides a display device which minimizes a dead space and a driving method thereof.

In addition, the present disclosure provides a display device whose image quality can be improved and a driving method thereof.

According to one embodiment of the present disclosure, a display device includes a first display area configured to include a plurality of first pixels which are disposed at least one horizontal line; a second display area configured to include a plurality of second pixels which are disposed in a plurality of horizontal lines; and an infrared (IR) light source configured to overlap the first display area in a plan view, in which the plurality of first pixels are set to be in a non-emission state during a period when the IR light source is driven.

In the embodiment, the plurality of second pixels may be driven in response to a data signal during a period when the IR light source is driven.

In the embodiment, the IR light source may be driven during a period of one frame, and the plurality of first pixels may be set to be in the non-emission state during the period of one frame.

In the embodiment, the IR light source may be driven during a first period which is a part of the period of one frame, and may not be driven during a second period which is a remaining period of one frame.

In the embodiment, the plurality of first pixels may be set to be in the non-emission state during the first period, and may be driven in response to a data signal during the second period.

In the embodiment, the IR light source may be included in a proximity sensor.

In the embodiment, the IR light source may be included in a fingerprint sensor.

In the embodiment, the first display area may be on an upper side of a panel.

In the embodiment, the first display area may be on a lower side of a panel.

In the embodiment, the display device may further includes a scan driver configured to drive a plurality of scan lines which are disposed in the first display area and the second display area, a light emission driver configured to drive a plurality of first light emission control lines which are disposed in the first display area and a plurality of second light emission control lines which are disposed in the second display area, and a data driver configured to drive a plurality of data lines which are disposed in the first display area and the second display area.

In the embodiment, the light emission driver may include a plurality of first light emission stages which are respectively connected to the plurality of first light emission control lines and a plurality of second light emission stages which are respectively connected to the plurality of second light emission control lines, in which the plurality of first light emission stages may be driven in response to a first start signal, and in which the plurality of second light emission stages may be driven in response to a second start signal.

In the embodiment, a width of the first start signal may be set to be different from a width of the second start signal during the period when the IR light source is driven.

In the embodiment, the first start signal may have a width greater than the second start signal during the period when IR light source is driven.

In the embodiment, the first start signal may be set to have the same width as the second start signal during a period when IR light source is not driven.

In the embodiment, the display device may further include a plurality of first switches configured to be disposed between each of the plurality of first light emission control lines and a reference power supply.

In the embodiment, the reference power supply may be set to a gate-off voltage such that a plurality of transistors which are included in the plurality of first pixels are turned off.

In the embodiment, the plurality of first switches may be turned on and a voltage of the reference power supply may be supplied to the plurality of first light emission control lines, during the period when the IR light source is driven.

In the embodiment, the first start signal may not be supplied during the period when IR light source is driven.

In the embodiment, each of the plurality of first pixels may include an organic light emitting diode, a driving transistor configured to control the amount of current which is supplied to a current path from a first power supply to a second power supply through the organic light emitting diode in response to a data signal, and at least one light emission control transistor configured to be disposed in the current path and to have a gate electrode which is connected to any one of the plurality of first light emission control lines.

In the embodiment, the light emission control transistor may be disposed between the first power supply and the driving transistor.

In the embodiment, the light emission control transistor may be disposed between the driving transistor and the second power supply.

In the embodiment, the light emission control transistor may include a first light emission control transistor configured to be disposed between the first power supply and the driving transistor, and a second light emission control transistor configured to be disposed between the driving transistor and the second power supply.

In the embodiment, the display device may further include a third display area configured to include a plurality of third pixels which are disposed in a plurality of horizontal lines.

In the embodiment, the first display area may be disposed between the second display area and the third display area.

In the embodiment, the plurality of second pixels and the plurality of third pixels may be set to be in a non-emission state during the period when the IR light source is driven.

In the embodiment, the display device may further includes a scan driver configured to drive a plurality of scan lines which are disposed in the first display area, the second display area, and the third display area; a light emission driver configured to drive the first light emission control lines which are disposed in the first display area, the second light emission control lines which are disposed in the second display area, and a plurality of third light emission control lines which are disposed in the third display area; and a data driver configured to drive a plurality of data lines which are disposed in the first display area, the second display area, and the third display area.

In the embodiment, the light emission driver includes a plurality of first light emission stages configured to be respectively connected to the first light emission control lines and to be driven in response to a first start signal. a plurality of second light emission stages configured to be respectively connected to the second light emission control lines and to be driven in response to a second start signal, and a plurality of third light emission stages configured to be respectively connected to the third light emission control lines and to be driven in response to a third start signal.

In the embodiment, a width of the first start signal may be set to be different from widths of the second start signal and the third start signal during the period when IR light source is driven.

In the embodiment, the width of the first start signal may be set to be greater than the widths of the second start signal and the third start signal.

In the embodiment, the widths of the first start signal, the second start signal, and the third start signal may be set to be the same during the period when IR light source is not driven.

According to another embodiment of the present disclosure, a display device includes a panel including k (k is a natural number greater than or equal to 2) display areas, each display area including a plurality of pixels; an IR light source configured to overlap a first display area of the k display areas in a plan view; a plurality of light emission control lines configured to be formed in the k display areas so as to control light emission and non-emission of the plurality of pixels; and a light emission driver configured to receive k start signals and to supply a light emission control signal to the plurality of light emission control lines in response to the k start signals.

In the embodiment, the plurality of pixels which are disposed in the first display area may be set to be in a non-emission state during a period when the IR light source is driven.

In the embodiment, the IR light source may be driven during a period of one frame, and the plurality of pixels which are disposed in the first display area may be set to be in the non-emission state during the period of one frame.

In the embodiment, the IR light source may be driven during a first period which is a part of the period of one frame, and may not be driven during a second period which is a remaining period of one frame.

In the embodiment, the plurality of pixels which are disposed in the first display area may be set to be in the non-emission state during the first period, and may be driven in response to a data signal during the second period.

In the embodiment, the display device may further include a timing controller configured to supply the k start signals to the light emission driver.

In the embodiment, the timing controller may supply a first start signal with a first width to the first display area during a period when the IR light source is driven, and may supply a second start signal with a second width different from the first width to other areas other than the first display area.

In the embodiment, the first width may be set to be greater than the second width.

In the embodiment, each of the plurality of pixels may include an organic light emitting diode; a driving transistor configured to control the amount of current which is supplied to a current path from a first power supply to a second power supply through the organic light emitting diode in response to a data signal; and at least one light emission control transistor configured to be disposed in the current path, to have a gate electrode which is connected to any one of the plurality of first light emission control lines, and to be turned off when the light emission control signal is supplied.

In the embodiment, the light emission control transistor may be disposed between the first power supply and the driving transistor.

In the embodiment, the light emission control transistor may be disposed between the driving transistor and the second power supply.

In the embodiment, the light emission control transistor may include a first light emission control transistor configured to be disposed between the first power supply and the driving transistor; and a second light emission control transistor configured to be disposed between the driving transistor and the second power supply.

According to still another embodiment of the present disclosure, a driving method of a display device including a first display area which overlaps an IR light source in a plan view and at least one second display area which does not overlap the IR light source, includes setting a plurality of pixels which are disposed in the first display area to be in a non-emission state during a period when the IR light source is driven.

In the embodiment, a plurality of pixels which are disposed in the second display area may be driven in response to a data signal during the period when the IR light source is driven.

In the embodiment, a plurality of pixels which are disposed in the first display area and the second display area may be driven in response to a data signal during the period when the IR light source is not driven.

According to one embodiment of the present disclosure, a display device includes a first display area including a plurality of first pixels connected to a scan line, a second display area including a plurality of second pixels connected to a plurality of scan lines, respectively, an infrared (IR) light source overlapping the first display area in a plan view, and a light emission driver including a first light emission stage which receives a first start signal and a second light emission stage which receives a second start signal. The plurality of first pixels may not emit light when the IR light source is driven.

In the embodiment, the first start signal and the second start signal may have different widths when the IR light source is driven.

In the embodiment, the first start signal may have a width greater than that of the second start signal when the IR light source is driven.

In the embodiment, the display device may further include a third display area including a plurality of third pixels connected to a scan line, the first display area being disposed between the second display area and the third display area, and a third light emission stage which receives a third start signal. A width of the first start signal may be set to be different from widths of the second start signal and the third start signal when the IR light source is driven.

The first light emission stage may be connected to a first light emission control line. The first light emission control line may receive a reference power supply when the IR light source is driven.

According to a display device and a driving method thereof of embodiments of the present disclosure, sensors are disposed in a pixel area, and thus, it is possible to minimize a dead space. In addition, according to the display device and the driving method thereof of the present disclosure, the sensors, that is, at least partial pixels which are disposed to overlap an IR light source during the IR light source is driven are set to be in a non-emission state, and thus, it is possible to prevent an abnormal light emission phenomenon of the pixels from occurring due to IR irradiation.

BRIEF DESCRIPTION OF THE DRAWINGS

FIGS. 1A and 1B illustrate a display panel according to an embodiment of the present disclosure.

FIG. 11 illustrates another example of the light emission driver of FIG. 3.

DETAILED DESCRIPTION OF THE EMBODIMENTS

Figure 2:
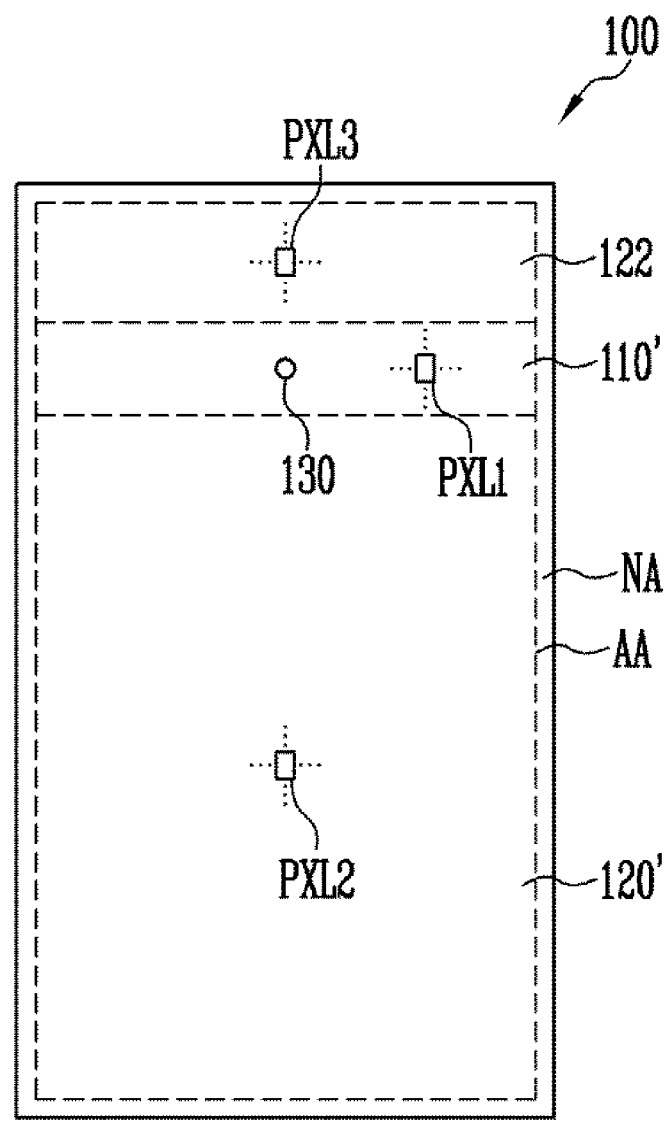
FIG. 2 illustrates a display panel according to another embodiment of the present disclosure.

Hereinafter, embodiments according to the present disclosure and contents necessary for the skilled in the art to easily understand the present disclosure will be described in detail with reference to the accompanying drawings. The present disclosure may be realized in various forms within the scope of Claims, and thus, the embodiment which will be described below are merely exemplary regardless of expressions thereof.

That is, the present disclosure is not limited to the embodiments which will be described below, may be realized in various forms, and in a case where it is hereinafter described that one unit is connected to another unit, the connection includes not only a direct connection but also an electrical connection through a certain element. In addition, it should be noted that the same symbols or reference numerals are attached to the same constituent elements in the drawings as far as possible although being illustrated in other drawings.

FIG. 1A illustrates a display panel according to an embodiment of the present disclosure. Hereinafter, the embodiment will be described by assuming that a display device is an organic electroluminescent display device for the sake of convenient description, but the display device of the present disclosure is not limited to organic electroluminescent display device.

Referring to FIG. 1A, a display panel 100 according to the embodiment of the present disclosure may include a pixel area AA and a peripheral area NA.

A plurality of pixels PXL1 and PXL2 are disposed at the pixel area AA, thereby displaying an image. That is, the pixel area AA is set as an active area. The pixel area AA includes a first display area 110 and a second display area 120.

The first display area 110 includes a plurality of the first pixels PXL1 formed in at least one horizontal line. An infra (IR) light source 130 (for example, IR LED) is disposed in the first display area 110 so as to overlap the first pixels PXL1. The IR light source 130 may be included in various sensors, and may operate in response to drive of the sensor. As an example, the IR light source 130 may be included in a proximity sensor and/or a fingerprint sensor.

If the IR light source 130 is included in the proximity sensor, the IR light source 130 can be driven during a period of a phone call. In addition, if the IR light source 130 is included in the fingerprint sensor, the IR light source 130 may be driven during a period when fingerprint is recognized.

Additionally, the IR light source 130 is driven when the first pixels PXL1 are set in a non-emitting state such that an abnormal light emission phenomenon does not occur in the first display area 110. That is, the first pixels PXL1 are set to be in a non-emission state during a period when the IR light source 130 is driven.

As an example, the first pixels PXL1 may be set to be in a non-emission state during a first period which is a part of one frame period, and may be set to be in a light emission state (that is, a state of being driven in response to a data signal) during a second period which is the remaining period of one frame period, in response to driving of the IR light source 130. Then, a sensor operates in response to driving of the IR light source 130 during the first period of one frame period, and a predetermined image is displayed in response to the data signal during the second period.

In addition, the first pixels PXL1 may be set to be in the non-emission state during one frame period in response to the driving of the IR light source 130. In this case, a black screen is displayed on the first display area 110 in response to the driving of the IR light source 130. Detailed description related to this will be described below.

When the IR light source 130 is not driven, the first pixels PXL1 display a predetermined image in response to the data signal.

The second display area 120 includes the second pixels PXL2 formed in a plurality of horizontal lines. The second pixels PXL2 are driven in response to the data signal regardless of the driving of the IR light source 130.

Constituent elements (for example, a driver, a wire, and the like) for driving the pixels PXL1 and PXL2 may be disposed in the peripheral area NA. The peripheral area NA may be disposed on the outside of the pixel area AA, but the embodiments according to the present disclosure are not limited to this.

As an example, the peripheral area NA may surround the pixel area AA. In addition, the peripheral area NA may be disposed only on an upper side and a lower side of the pixel area AA. In addition, the peripheral area NA may be removed from the display panel 100. In this case, the constituent elements for driving the pixels PXL1 and PXL2 may be disposed in another substrate, or may be disposed in an area overlapping the pixel area AA.

Meanwhile, FIG. 1 illustrated that the first display area 110 is disposed on an upper side of the display panel 100, but the present disclosure is not limited to this. As an example, the first display area 110 may be disposed on a lower side of the display panel 100 as described in FIG. 1B. That is, in the embodiments according to the present disclosure, the first display area 110 may be disposed in various positions.

FIG. 2 illustrates a display panel according to another embodiment of the present disclosure.

Referring to FIG. 2, the display panel 100 according to the present embodiment of the present disclosure may include the pixel area AA and the peripheral area NA.

A plurality of pixels PXL1, PXL2, and PXL3 may be disposed in the pixel area AA, thereby displaying a predetermined image. That is, the pixel area AA is an active area. The pixel area AA may include a first display area 110', a second display area 120', and a third display area 122.

The first display area 110' is disposed between the second display area 120' and the third display area 122. The first display area 110' includes the first pixels PXL1 formed in at least one horizontal line. In addition, the IR light source 130 is disposed in the first display area 110' so as to overlap at least a part of the first pixels PXL1. The IR light source 130 may be included in various sensors and may operate in response to driving of the sensors.

The IR light source 130 is driven during a period when the first pixels PXL1 are set in a light non-emitting state such that an abnormal light emission phenomenon does not occur in the first display area 110'. That is, the first pixels PXL1 are set to be in a non-emission state during a period when the IR light source 130 is driven.

As an example, the first pixels PXL1 may be set to be in the non-emission state in response to the driving of the IR light source 130 during the first period of one frame, and may be set to be in the light emission state (that is, driven in response to the data signal) during the second period of one frame period. Then, a sensor operates in response to the driving of the IR light source 130 during the first period of one frame, and a predetermined image is displayed in response to the data signal during the second period.

In addition, the first pixels PXL1 may be set to be in the non-emission state during one frame period in response to the driving of the IR light source 130. In this case, a black screen is displayed on the first display area 110' in response to the driving of the IR light source 130.

The second display area 120' includes the second pixels PXL2 formed in a plurality of horizontal lines. The second pixels PXL2 are driven in response to the data signal regardless of the driving of the IR light source 130.

The third display area 122 includes the third pixels PXL3 formed in the plurality of horizontal lines. The third pixels PXL3 are driven in response to the data signal regardless of the driving of the IR light source 130.

Constituent elements (for example, a driver, a wire, and the like) for driving the pixels PXL1, PXL2, and PXL3 may be disposed in the peripheral area NA. For this reason, the peripheral area NA may surround the pixel area AA. In addition, the peripheral area NA may be disposed only on an upper side and a lower side of the pixel area AA. In addition, the peripheral area NA may be removed from the display panel 100. In this case, constituent elements for driving the pixels PXL1, PXL2, and PXL3 may be disposed in another substrate, or may be disposed in an area overlapping the pixel area AA.

In the aforementioned FIG. 1A to FIG. 2, the IR light source 130 is disposed in the pixel area AA so as to minimize a dead space.

In addition, the first pixels PXL1 are set to be in the non-emission state during a period when the IR light source 130 is driven, so as to prevent an abnormal light emission phenomenon from occurring in the first display areas 110 and 110'.

Figure 3:
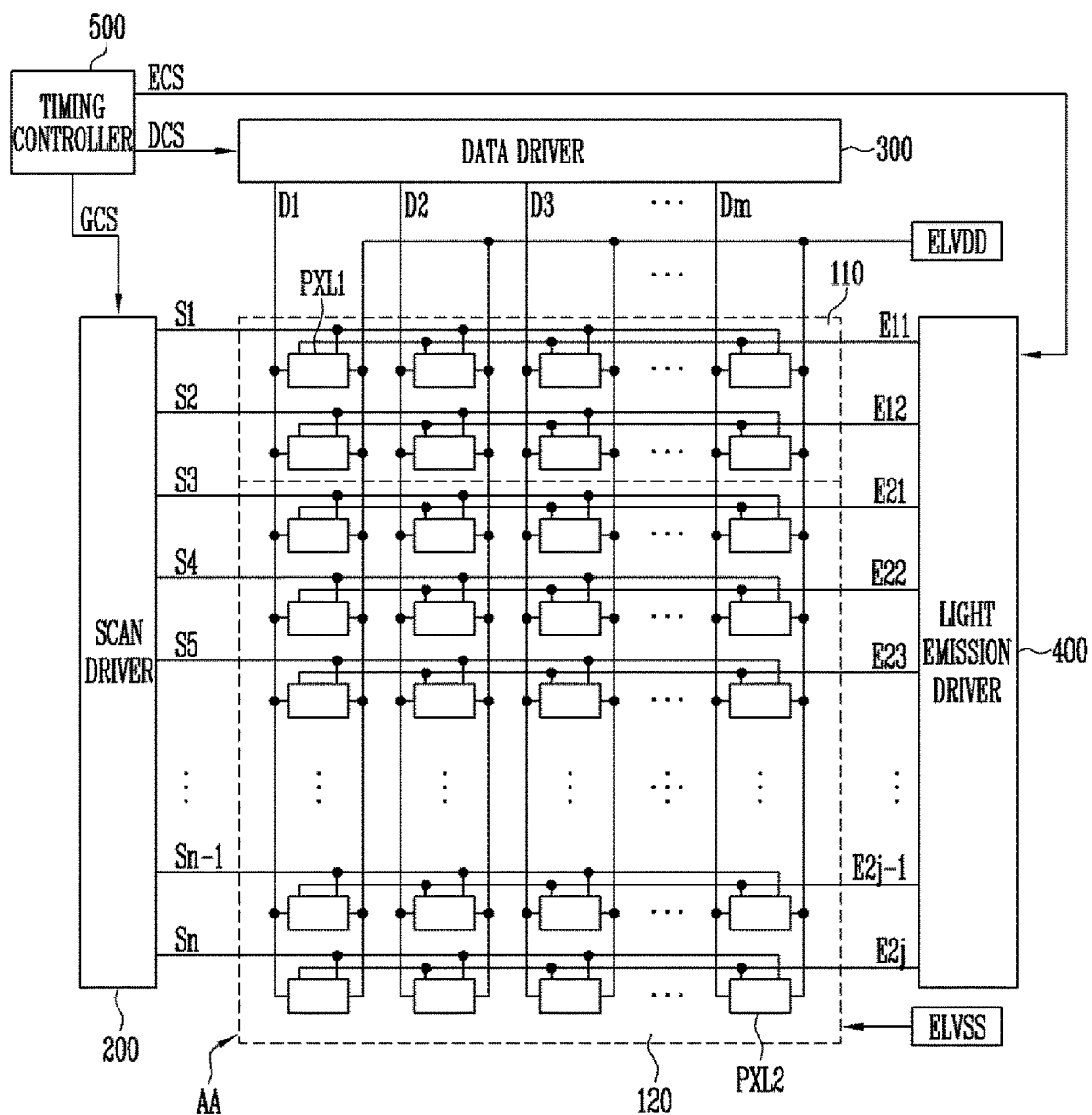
FIG. 3 illustrates a display device including the display panel of FIG. 1A.

FIG. 3 illustrates a display device including the display panel of FIG. 1A.

Referring to FIG. 3, the display device according to the embodiment of the present disclosure includes a scan driver 200, a data driver 300, a light emission driver 400, and a timing controller 500.

The first pixels PXL1 are disposed in the first display area 110 so as to be connected to scan lines S1 and S2, the first light emission control lines E11 and E12, and data lines D1 to Dm. When scan signals are supplied from the scan lines S1 and S2, the first pixels PXL1 receive data signals from the data lines D1 to Dm. The first pixels PXL1 received the data signals control the amount of current flowing from a first power supply ELVDD to a second power supply ELVSS through an organic light emitting diode (not illustrated). The first pixels PXL1 control light emission time in response to light emission control signals which are supplied from first light emission control lines E11 and E12.

The first pixels PXL1 are set to be in the non-emission state during a period when the IR light source 130 is driven. For this, the light emission driver 400 controls the light emission control signals which are supplied to the first light emission control lines E11 and E12 such that the first pixels PXL1 are set to be in the non-emission state during the period when the IR light source 130 is driven.

As an example, the light emission driver 400 may supply the light emission control signals to the first light emission control lines E11 and E12 such that the first pixels PXL1 are set to be in the non-emission state during the first period of a period of one frame in response to the driving of the IR light source 130.

In addition, the light emission driver 400 may supply the light emission control signals to the first light emission control lines E11 and E12 such that the first pixels PXL1 do not emit light during the period of one frame in response to the driving of the IR light source 130.

Meanwhile, FIG. 3 illustrates that the first pixels PXL1 are disposed in two horizontal lines for the sake of convenient description, but the present disclosure is not limited to this. As an example, the first pixels PXL1 may be disposed at least one horizontal line, and the number of the scan lines S1 and S2 and the first light emission control lines E11 and E12 which are formed in the first display area 110 in response to the disposition of the first pixels PXL1 may be changed.

The second pixels PXL2 are disposed in the second display area 120 so as to be connected to scan lines S3 to Sn, second light emission control lines E21 to E2j (j is a natural number less than n), and the data lines D1 to Dm. When scan signals are supplied to the scan lines S3 to Sn, the second pixels PXL2 receive the data signals from the data lines D1 to Dm. The second pixels PXL2 received the data signals control the amount of current flowing from a first power supply ELVDD to a second power supply ELVSS through an organic light emitting diode (not illustrated). The second pixels PXL2 control light emission time in response to light emission control signals which are supplied from the second light emission control lines E21 to E2j.

The scan driver 200 supplies the scan signals to the scan lines S1 to Sn in response to a gate control signal GCS output from the timing controller 500. As an example, the scan driver 200 may sequentially supply the scan signals to the scan lines S1 to Sn. If the scan signals are sequentially supplied to the scan lines S1 to Sn, the first pixels PXL1 and the second pixels PXL2 are sequentially selected one horizontal line at a time. For this, the scan signals are set to have a gate-on voltage which can turns on transistors included in the pixels PXL1 and PXL2.

The scan driver 200 may be formed in the peripheral area NA through a thin film process. In addition, the scan driver 200 may be disposed to overlap the pixel area AA. In addition, the scan driver 200 may be formed on both sides between which the pixel area AA is interposed.

The light emission driver 400 supplies the light emission control signals to the first light emission control lines E11 and E12 and the second light emission control lines E21 to E2j in response to an emission control signal ECS output from the timing controller 500. As an example, the light emission driver 400 may sequentially supply the light emission control signals to the first light emission control lines E11 and E12 and the second light emission control lines E21 to E2j. The light emission control signals may be used for controlling light emission time of the pixels PXL1 and PXL2. For this, the light emission control signals may be set to have a gate-off voltage which can turns off transistors included in the pixels PXL1 and PXL2.

During a period when the IR light source 130 is not driven, the light emission driver 400 may sequentially supply the light emission control signals with a second width to the first light emission control lines E11 and E12 and the second light emission control lines E21 to E2j. Here, the light emission control signals with the second width are set such that the first pixels PXL1 and the second pixels PXL2 display a predetermined image in response to the data signal.

In addition, the light emission driver 400 may supply the light emission control signals with a width greater than the second width to the first light emission control lines E11 and E12 during the period when the IR light source 130 is driven. As an example, the light emission driver 400 may supply the light emission control signals with a first width greater than the second width to the first light emission control lines E11 and E12 during the period when the IR light source 130 is driven. Here, the light emission control signals with the first width may be set in response to the period of one frame.

In addition, the light emission driver 400 may supply light emission control signals with a third width to the first light emission control lines E11 and E12 in response to the driving of the IR light source 130. Here, the third width may be set to be greater than the second width, and to be smaller than the first width.

Additionally, the light emission control signals with the third width may be set such that the first pixels PXL1 disposed in the first display area 110 do not emit light during the first period of the period of one frame. The first pixels PXL1 receiving the light emission control signals with the third width do not emit light during the first period of the period of one frame, and are driven in response to the data signal during the second period. At this time, the IR light source 130 are driven during the first period of the period of one frame.

The light emission driver 400 may be formed in the peripheral area NA through a thin film process. In addition, the light emission driver 400 may be disposed to overlap the pixel area AA. In addition, the light emission driver 400 may be formed on both sides between which the pixel area AA is interposed.

The data driver 300 supplies the data signals to the data lines D1 to Dm in response to a data control signal DCS. The data signals which are supplied to the data lines D1 to Dm are supplied to the pixels PXL1 and PXL2 which are selected by the scan signals. Here, the data drive 300 is illustrated to be disposed on an upper side of the pixel area AA, but the present disclosure is not limited to this. As an example, the data drive 300 may be disposed on a lower side of the pixel area AA.

The timing controller 500 generates the gate control signal GCS, the emission control signal ECS, and the data control signal DCS, bases on timing signals which are supplied from the outside, for example, a graphic controller (not illustrated). The gate control signal GCS which is generated by the timing controller 500 is supplied to the scan driver 200, and the emission control signal ECS is supplied to the light emission driver 400. In addition, the data control signal DCS which is generated by the timing controller 500 is supplied to the data driver 300.

Figure 4:
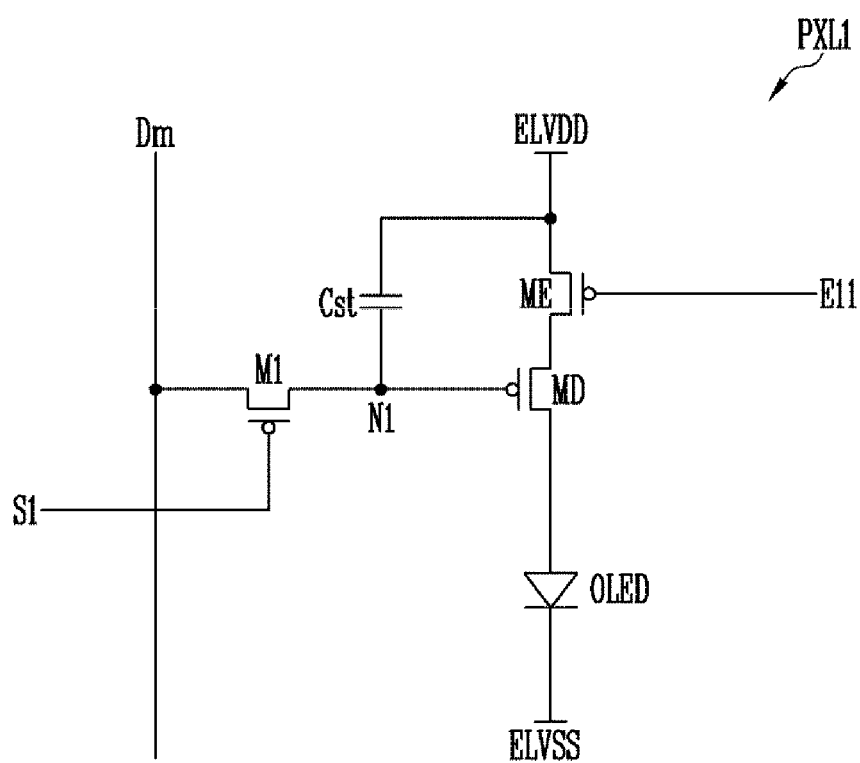
FIG. 4 illustrates an example of a first pixel of FIG. 3.

FIG. 4 illustrates an example of a first pixel of FIG. 3. FIG. 4 illustrates a pixel connected to the mth data line Dm and the first scan line S1 for the sake of convenient description.

Referring to FIG. 4, the first pixel PXL1 according to the embodiment of the present disclosure includes an organic light emitting diode OLED, a driving transistor MD, a light emission control transistor ME, a first transistor M1, and a storage capacitor Cst.

An anode electrode of the organic light emitting diode OLED is connected to a second electrode of the driving transistor MD, and a cathode electrode thereof is connected to the second power supply ELVSS. The organic light emitting diode OLED generates light with predetermined luminance in response to the amount of current which is supplied from the driving transistor MD. For this, the first power supply ELVDD is set to a voltage higher than the second power supply ELVSS.

A first electrode of the driving transistor MD is connected to the first power supply ELVDD through the light emission control transistor ME, and a second electrode of the driving transistor MD is connected to the anode electrode of the organic light emitting diode OLED. In addition, a gate electrode of the driving transistor MD is connected to a first node N1. The driving transistor MD controls the amount of current which is supplied from the first power supply ELVDD to the second power supply ELVSS through the organic light emitting diode OLED in response to a voltage of the first node N1.

The first transistor M1 is connected between the data line Dm and the first node N1. In addition, a gate electrode of the first transistor M1 is connected to the scan line S1. The first transistor M1 is turned on when the scan signal is supplied to the scan line S1, and electrically connects the data line Dm to the first node N1.

The light emission control transistor ME is connected between the first power supply ELVDD and the first electrode of the driving transistor MD. In addition, a gate electrode of the light emission control transistor ME is connected to the first light emission control line E11. The light emission control transistor ME is turned off when the light emission control signal is supplied to the first light emission control line E11, and is turned on when the light emission control signal is not supplied.

The storage capacitor Cst is connected between the first power supply ELVDD and the first node N1. The storage capacitor Cst stores a voltage corresponding to the data signal.

Meanwhile, the second pixel PXL2 may be realized by the same circuit as the first pixel PXL1. Hence, detailed description on the second pixels PXL2 will be omitted.

Figure 5A:
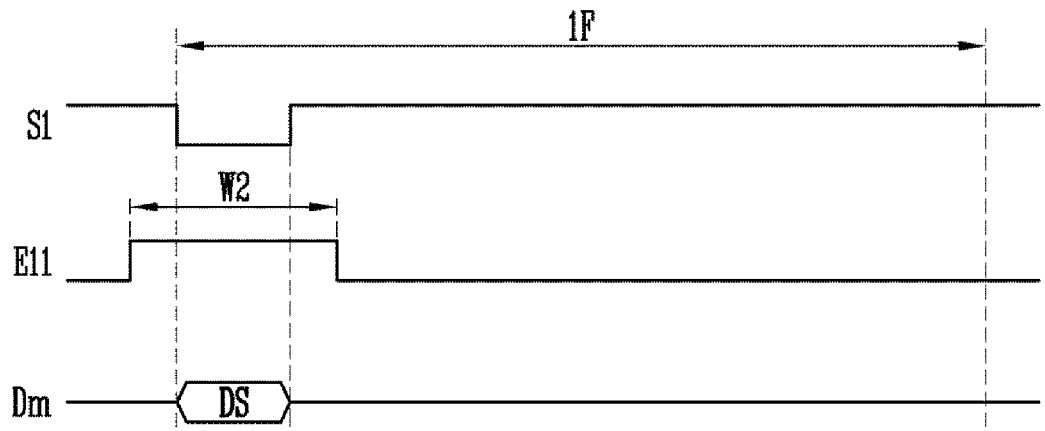
FIGS. 5A, 5B and 5C illustrate a drive method of the first pixel of FIG. 4.

FIG. 5A illustrate one example of a drive method of the first pixel of FIG. 4. FIG. 5A illustrates a case where the light emission control signal with the second width is supplied to the first light emission control line E11.

Referring to FIG. 5A, the light emission control signal with a second width W2 is supplied to the first light emission control line E11. If the light emission control signal is supplied to the first light emission control line E11, the light emission control transistor ME is turned off.

Thereafter, the scan signal is supplied to the scan line S1. If the scan signal is supplied to the scan line S1, the first transistor M1 is turned on. If the first transistor M1 is turned on, a data signal DS from the data line Dm is supplied to the first node N1. At this time, the storage capacitor Cst stores a voltage of the data signal DS which is supplied to the first node N1.

After the voltage of the data signal DS is stored in the storage capacitor Cst, supplying of the light emission control signal to the first light emission control line E11 is stopped. If supplying of the light emission control signal to the first light emission control line E11 is stopped, the light emission control transistor ME is turned on. If the light emission control transistor ME is turned on, the first power supply ELVDD is electrically connected to the driving transistor MD. At this time, the driving transistor MD controls the amount of current which is supplied to the organic light emitting diode OLED in response to the voltage of the first node N1. Then, the organic light emitting diode OLED emits light in response to the amount of current which is supplied to the driving transistor MD. The first pixel PXL1 and the second pixels PXL2 may be driven by the aforementioned method during the period when the IR light source 130 is not driven.

Meanwhile, the first transistor M1 is irradiated with light from the first pixel PXL1 during the period when the IR light source 130 is driven. If the first transistor M1 is irradiated with IR, a leakage current occurs in the first transistor M1, and thereby the voltage of the first node N1 changes. That is, the first pixel PXL1 does not emit light with desired luminance during a period when the IR light source 130 is driven, and thus, image quality is degraded.

Figure 5B:
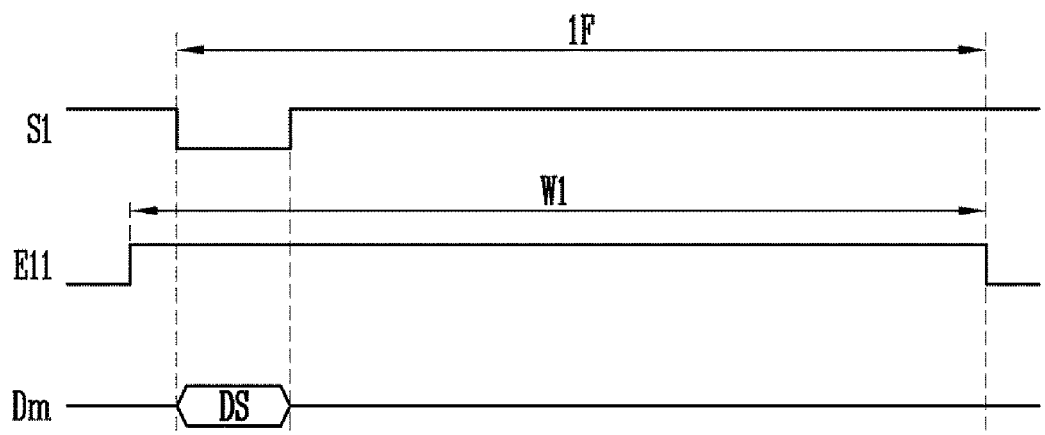

FIG. 5B illustrate another example of the drive method of the first pixel of FIG. 4. FIG. 5B illustrates a case where the light emission control signal with a first width W1 is supplied to the first light emission control line E11 in response to the driving of the IR light source 130.

Referring to FIG. 5B, the light emission control signal with the first width W1 is supplied to the first light emission control line E11. If the light emission control signal with the first width W1 is supplied to the first light emission control line E11, the light emission control transistor ME is turned off.

Here, the first width W1 is set such that the first pixel PXL1 is turned off during a period of one frame 1F. That is, the light emission control transistor ME which receives the light emission control signal with the first width W1 maintains in a state of being turned off during the period of one frame 1F. Then, the first pixel PXL1 maintains in a non-emission state during the period of one frame 1F regardless of the data signal DS which is supplied to the data line Dm.

That is, the first pixel PXL1 is set in the non-emission state during the period when the IR light source 130 is driven, and thus, it is possible to prevent the first pixel PXL1 from emitting light with undesired luminance.

Figure 5C:
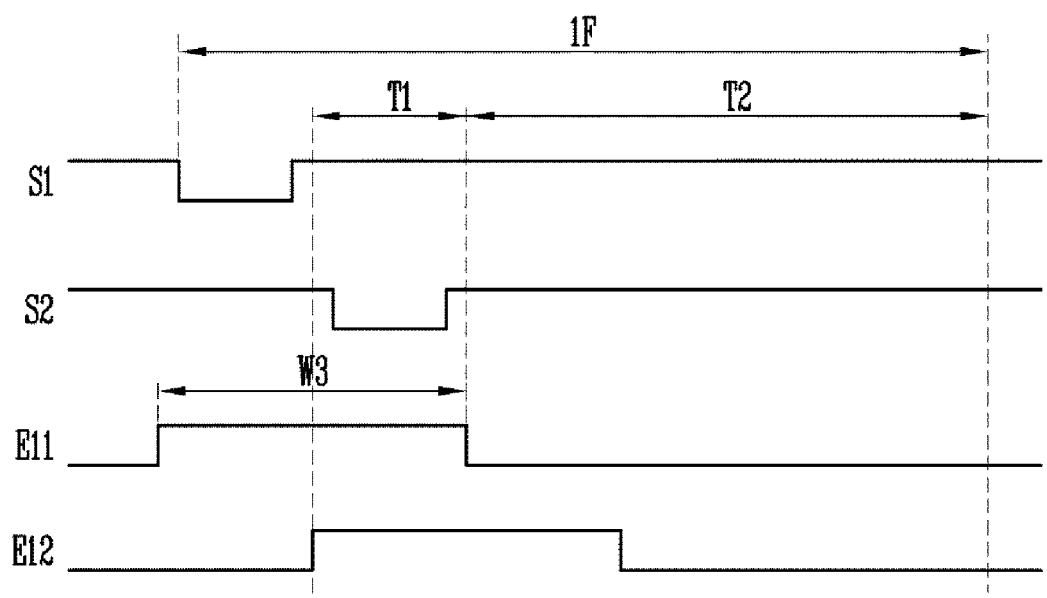

FIG. 5C illustrate still another example of the drive method of the first pixel of FIG. 4. FIG. 5C illustrates a case where the light emission control signal with a third width W3 is supplied in response to the driving of the IR light source 130.

Referring to FIG. 5C, the light emission control signals with the third width W3, which is longer than the second width W2 and shorter than the first width W1, are sequentially supplied to the first light emission control lines E11 and E12. The light emission control signals which are supplied to the first light emission control lines E11 and E12 overlap each other during the first period T1 of the period of one frame 1F. Hence, the first pixel PXL1 is set in the non-emission state during the first period T1 of the period of one frame 1F. The IR light source 130 is driven during the first period T1 of the period of one frame 1F.

In addition, the first pixels PXL1 are sequentially driven in response to the data signal during a second period T2 of the period of one frame 1F.

That is, in still another example of the present disclosure, the first pixels PXL1 are set in the non-emission state during the first period T1 of the period of one frame 1F, and the IR light source 130 is driven in response to this. In addition, the first pixel PXL1 is driven in response to the data signal during the second period T2 of the period of one frame.

Additionally, the light emission control signal with the third width W3 is experimentally determined such that the first pixels PXL1 are set to be in the non-emission state in the same time. As an example, the third width W3 may be set in various types in response to the number of the first light emission control lines E11 and E12.

Figure 6A:
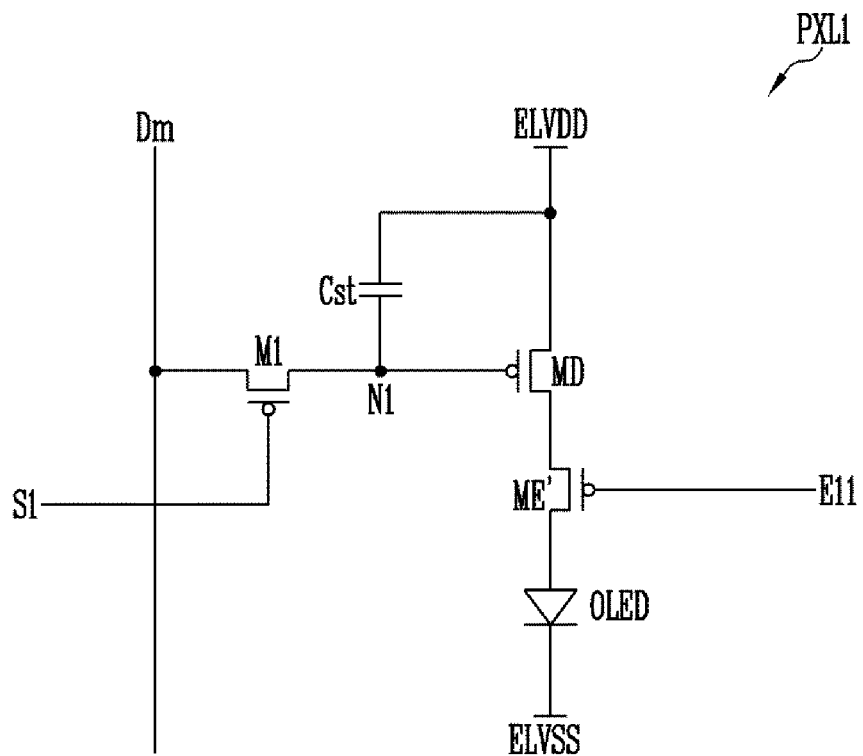
FIGS. 6A and 6B illustrate another example of the first pixel of FIG. 3.

FIG. 6A illustrates another example of the first pixel of FIG. 3. In FIG. 6A, the same elements as those of FIG. 4 are denoted by same reference numerals and a detailed description thereof will be omitted.

Referring to FIG. 6A, the first pixel PXL1 according to the embodiment of the present disclosure includes the organic light emitting diode OLED, the driving transistor MD, the light emission control transistor ME', and the first transistor M1.

The light emission control transistor ME' is connected between a second electrode of the driving transistor MD and the organic light emitting diode OLED. In addition, a gate electrode of the light emission control transistor ME' is connected to the first light emission control line E11. The light emission control transistor ME' is turned off when the light emission control signal is supplied to the first light emission control line E11, and is turned on when the light emission control signal is not supplied to the first light emission control line E11.

Meanwhile, in the present embodiment of the present disclosure, the light emission control transistor may be disposed in various types in a current path which is formed from the first power supply ELVDD to the second power supply ELVSS through the organic light emitting diode OLED.

Figure 6B:
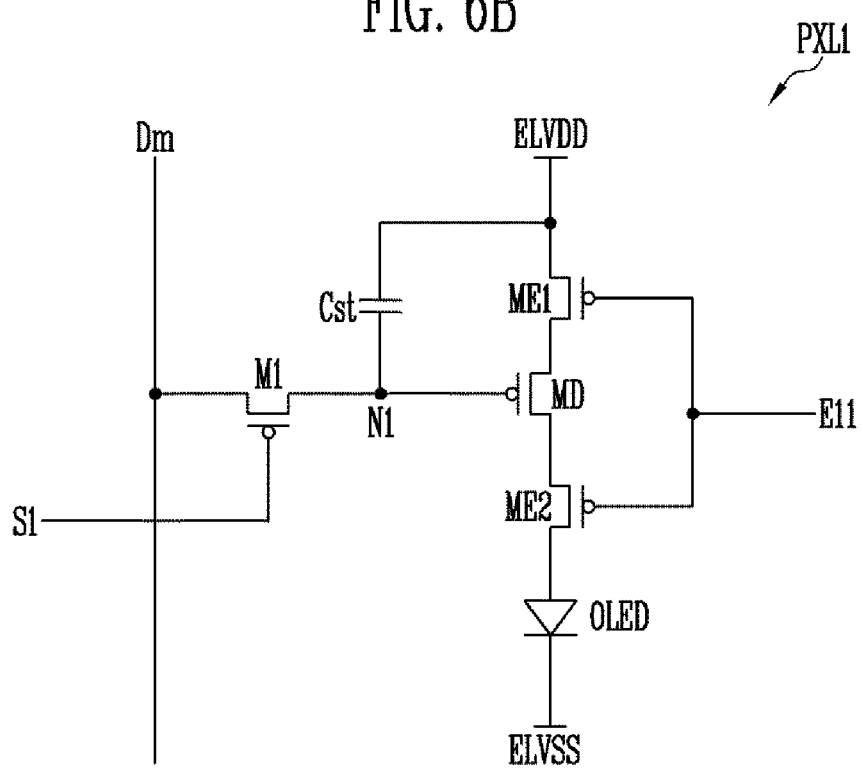

As an example, a first light emission control transistor ME1 may be formed between the first power supply ELVDD and the first electrode of the driving transistor MD, and a second light emission control transistor ME2 may be formed between the second electrode of the driving transistor MD and the anode electrode of the organic light emitting diode OLED, as illustrated in FIG. 6B. Gate electrodes of the first light emission control transistor ME1 and the second light emission control transistor ME2 are connected to the first light emission control line E11. Hence, the first light emission control transistor ME1 and the second light emission control transistor ME2 are turned on and turned off in response to the light emission control signal which is supplied to the first light emission control line E11.

Actually, operations of the first pixels PXL1 of FIG. 6A and FIG. 6B are the same as the operation of the pixel of FIG. 4 described with reference to FIGS. 5A to 5C, and thus, detailed description thereof will be omitted.

Figure 7:
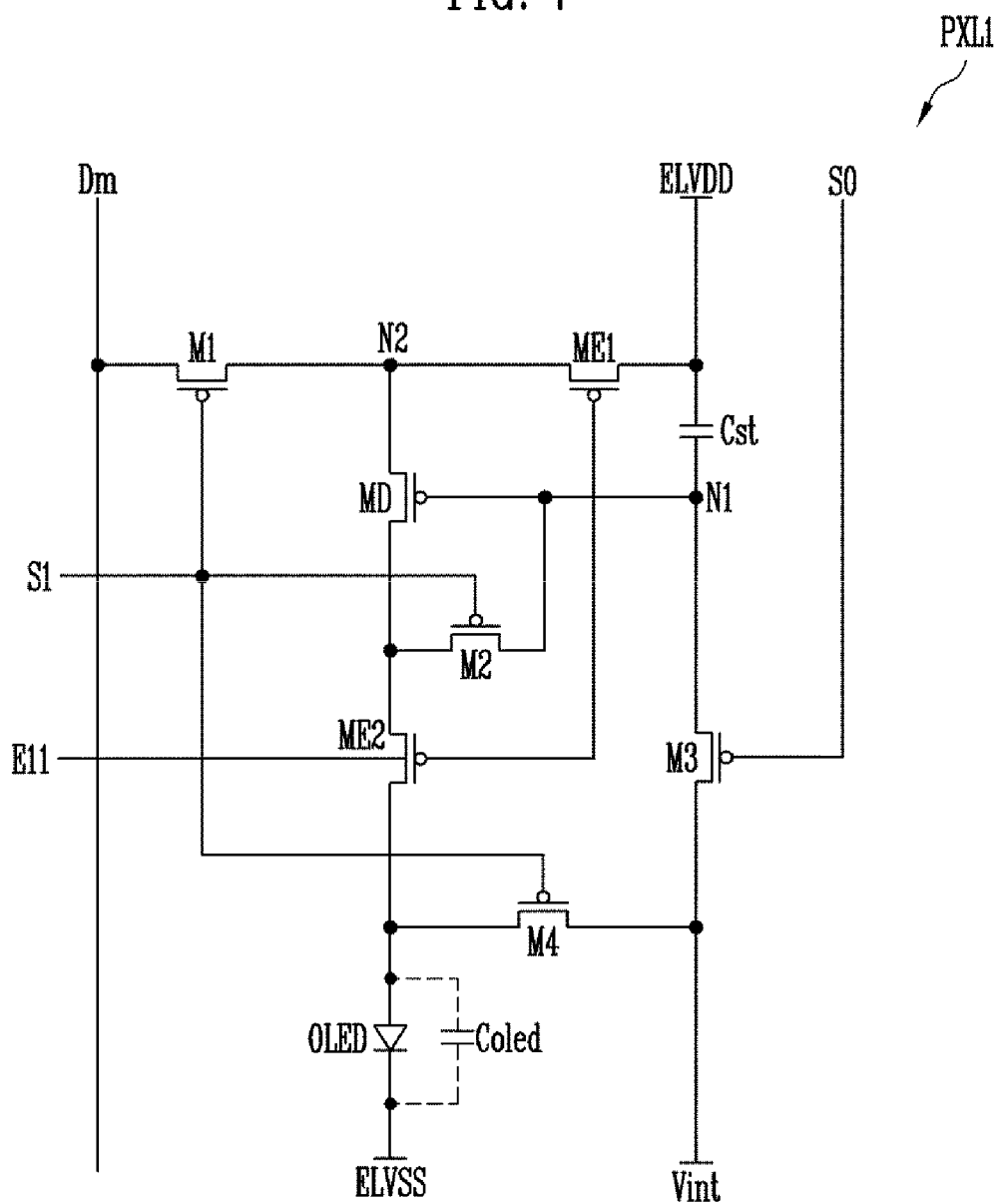
FIG. 7 illustrates still another example of the first pixel of FIG. 3.

FIG. 7 illustrates still another example of the first pixel of FIG. 3. FIG. 7 illustrates a pixel connected to an mth data line and a first scan line S1 for the sake of convenient description. In addition, the same symbols or reference numerals are attached to transistors having the same function as in FIG. 6B. Additionally, a zeroth scan line S0 of FIG. 7 indicates a scan line additionally formed in the pixel area AA corresponding to a circuit structure of the first pixel PXL1.

Referring to FIG. 7, the first pixel PXL1 according to still another example of the present disclosure includes the organic light emitting diode OLED, the driving transistor MD, the light emission control transistors ME1 and ME2, the transistors M1 to M4, and the storage capacitor Cst.

The anode electrode of the organic light emitting diode OLED is connected to the second electrode of the driving transistor MD through the second light emission control transistor ME2, and the cathode electrode thereof is connected to the second power supply ELVSS. The organic light emitting diode OLED generates light with predetermined luminance in response to the amount of current which is supplied from the driving transistor MD.

The first electrode of the driving transistor MD is connected to the first power supply ELVDD through the first light emission control transistor ME1, and the second electrode thereof is connected to the anode electrode of the organic light emitting diode OLED through the second light emission control transistor ME2. In addition, the gate electrode of the driving transistor MD is connected to the first node N1. The driving transistor MD controls the amount of current which is supplied from the first power supply ELVDD to the second power supply ELVSS through the organic light emitting diode OLED.

The first light emission control transistor ME1 is connected between the first power supply ELVDD and a second node N2. In addition, a gate electrode of the first light emission control transistor ME1 is connected to the first light emission control line E11. The first light emission control transistor ME1 is turned off when the light emission control signal is supplied to the first light emission control line E11, and is turned on in other cases.

The second light emission control transistor ME2 is connected between the second electrode of the driving transistor MD and the anode electrode of the organic light emitting diode OLED. In addition, the gate electrode of the second light emission control transistor ME2 is connected to the first light emission control line E11. The second light emission control transistor ME2 is turned off when the light emission control signal is supplied to the first light emission control line E11, and is turned on in other cases.

The first transistor M1 is connected between the data line Dm and the second node N2. In addition, a gate electrode of the first transistor M1 is connected to the first scan line S1. When the scan signal is supplied to the first scan line S1, the first transistor M1 is turned on, thereby, electrically connecting the data line Dm to the second node N2.

The second transistor M2 is connected between the second electrode of the driving transistor MD and the first node N1. In addition, a gate electrode of the second transistor M2 is connected to the first scan line S1. When the scan signal is supplied to the first scan line S1, the second transistor M2 is turned on, thereby, connecting the driving transistor MD in a diode type.

A first electrode of the third transistor M3 is connected to the first node N1, and a second electrode thereof is connected to an initialization power supply Vint. In addition, a gate electrode of the third transistor M3 is connected to the zeroth scan line S0. When the scan signal is supplied to the zeroth scan line S0, the third transistor M3 is turned on, thereby, supplying a voltage of the initialization power supply Vint to the first node N1. Here, the voltage of the initialization power supply Vint is set to a voltage lower than a voltage of the data signal.

The fourth transistor M4 is connected between the anode electrode of the organic light emitting diode OLED and the initialization power supply Vint. In addition, a gate electrode of the fourth transistor M4 is connected to the first scan line S1. When the scan signal is supplied to the first scan line S1, the fourth transistor M4 is turned on, thereby, supplying the voltage of the initialization power supply Vint to the anode electrode of the organic light emitting diode OLED.

If the voltage of the initialization power supply Vint is supplied to the anode electrode of the organic light emitting diode OLED, a parasitic capacitor Coled of the organic light emitting diode OLED is discharged, thereby improving black display capability.

Additionally, the gate electrode of the fourth transistor M4 may be connected to various scan lines. As an example, the fourth transistor M4 may be turned on by any one of the scan signals overlapping the light emission control signal which is supplied to the first light emission control line E11.

The storage capacitor Cst is connected between the first power supply ELVDD and the first node N1. The storage capacitor Cst stores a voltage which is applied to the first node N1.

Meanwhile, the second pixels PXL2 may be realized by the same circuit as the first pixel PXL1. Hence, detailed description on the second pixels PXL2 will be omitted.

Figure 8A:
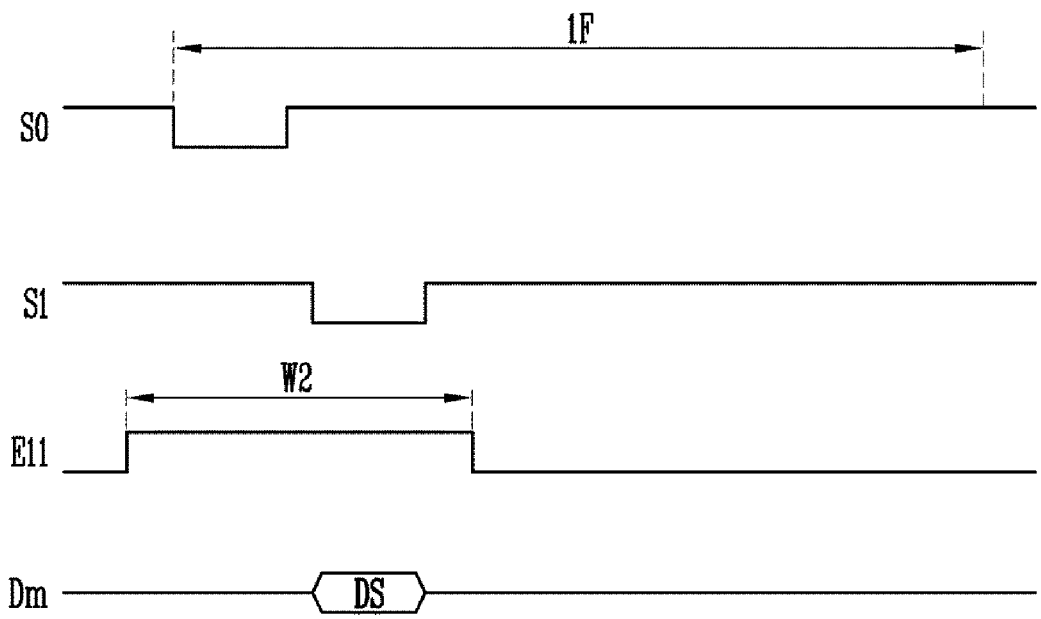
FIGS. 8A, 8B and 8C illustrate a drive method of the first pixel of FIG. 7.

FIG. 8A illustrates an example of a drive method of the first pixel of FIG. 7. FIG. 8A illustrates a case where the light emission control signal with the second width W2 is supplied to the first light emission control line E11.

Referring to FIG. 8A, the light emission control signal is supplied to the first light emission control line E11, and thereby, the first light emission control transistor ME1 and the second light emission control transistor ME2 are turned off. If the first light emission control transistor ME1 is turned off, the first power supply ELVDD is electrically disconnected from the second node N2. If the second light emission control transistor ME2 is turned off, the driving transistor MD is electrically disconnected from the organic light emitting diode OLED. Hence, the first pixel PXL1 is set in a non-emission state during a period when the light emission control signal is supplied to the first light emission control line E11.

Thereafter, the scan signal is supplied to the zeroth scan line S0. If the scan signal is supplied to the zeroth scan line S0, the third transistor M3 is turned on. If the third transistor M3 is turned on, the voltage of the initialization power supply Vint is supplied to the first node N1.

After the voltage of the initialization power supply Vint is supplied to the first node N1, the scan signal is supplied to the first scan line S1. If the scan signal is supplied to the first scan line S1, the first transistor M1, the second transistor M2, and the fourth transistor M4 are turned on.

If the fourth transistor M4 is turned on, the voltage of the initialization power supply Vint is supplied to the anode electrode of the organic light emitting diode OLED, and thus, the parasitic capacitor Coled is discharged.

If the second transistor M2 is turned on, the driving transistor MD is connected in a diode type. If the first transistor M1 is turned on, the data signal DS from the data line Dm is supplied to the second node N2. At this time, since a voltage of the first node N1 is initialized to the voltage of the initialization power supply Vint lower than the data signal, the driving transistor MD is turned on.

If the driving transistor MD is turned on, the data signal supplied to the second node N2 is supplied to the first node N1 through the driving transistor MD connected in a diode type. At this time, the data signal and a voltage corresponding to a threshold voltage of the driving transistor MD are applied to the first node N1. The storage capacitor Cst stores the voltage applied to the first node N1.

After the data signal and the voltage corresponding to the threshold voltage of the driving transistor MD are stored in the storage capacitor Cst, supplying of the light emission control signal to the first light emission control line E11 is stopped. If supplying of the light emission control signal to the first light emission control line E11 is stopped, the first light emission control transistor ME1 and the second light emission control transistor ME2 are turned on.

If the first light emission control transistor ME1 is turned on, the first power supply ELVDD is electrically connected to the first electrode of the driving transistor MD. If the second light emission control transistor ME2 is turned on, the second electrode of the driving transistor MD is electrically connected to the anode electrode of the organic light emitting diode OLED. At this time, the driving transistor MD controls the amount of current flowing from the first power supply ELVDD to the second power supply ELVSS through the organic light emitting diode OLED in response to the voltage applied to the first node N1.

The first pixel PXL1 and the second pixels PXL2 may be driven by the aforementioned method during the period when the IR light source 130 is not driven.

Meanwhile, the first pixel PXL1 is irradiated with IR during the period when the IR light source 130 is driven, and thus, leakage currents are generated in the first transistor M1, the second transistor M2, and the third transistor M3.

Particularly, the voltage of the first node N1 is continuously decreased by the leakage currents which are generated from the second transistor M2 and the third transistor M3 during the period of one frame 1F. The current flowing form the driving transistor MD into the organic light emitting diode OLED is proportional to the square of a voltage which is obtained by subtracting a threshold voltage of the driving transistor MD from a Vgs voltage of the driving transistor MD. Hence, if the voltage of the first node N1 decreases, the current following through the driving transistor MD increases in proportional to the square, and thus, the first pixel PXL1 can be recognized to a user as a bright pixel having a higher brightness than the pixels adjacent to the first pixel.

Figure 8B:
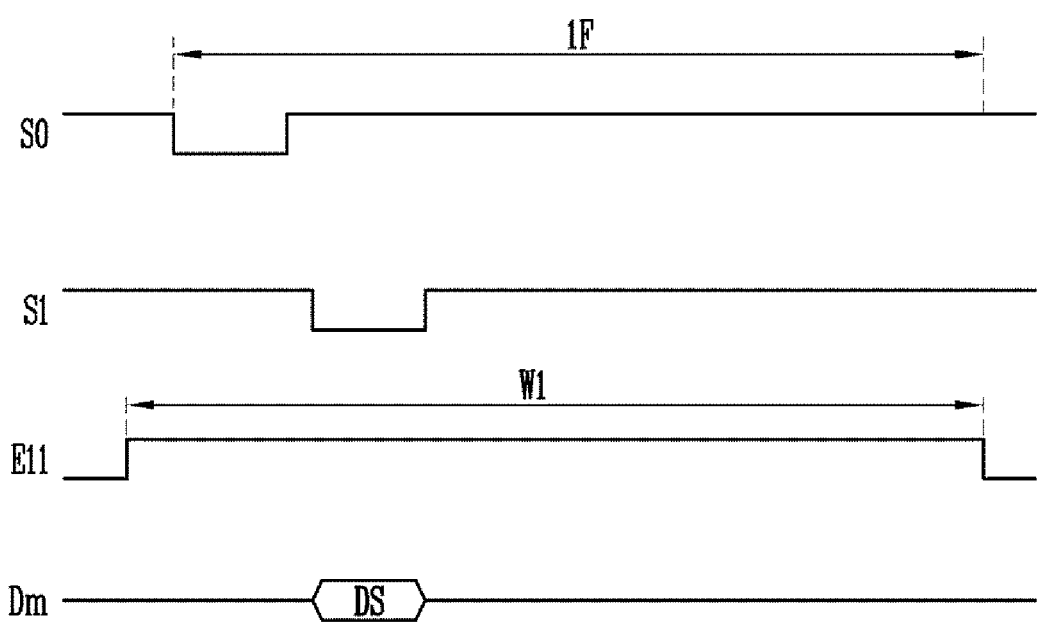

FIG. 8B illustrates another example of the drive method of the first pixel of FIG. 7. FIG. 8B illustrates a case where the light emission control signal with the first width W1 is supplied to the first light emission control line E11 in response to driving of the IR light source 130.

Referring to FIG. 8B, the light emission control signal with the first width W1 is first supplied to the first light emission control line E11. If the light emission control signal with the first width W1 is supplied to the first light emission control line E11, the first light emission control transistor ME1 and the second light emission control transistor ME2 are turned off.

If the first light emission control transistor ME1 and the second light emission control transistor ME2 are turned off, the first pixel PXL1 is set to be in a non-emission state. Here, the first width W1 is set such that the first pixel PXL1 is turned off during the period of one frame 1F. That is, the first and second light emission control transistors ME1 and ME2 which receive the light emission control signal with the first width W1 maintain in a state of being turned off during the period of one frame 1F. Then, the first pixel PXL1 maintains in the non-emission state during the period of one frame 1F regardless of the data signal DS which is supplied to the data line Dm.

That is, the first pixel PXL1 is set to be in the non-emission state during the period when the IR light source 130 is driven, and thus, it is possible to prevent the first pixel PXL1 from emitting light with undesired luminance.

Figure 8C:
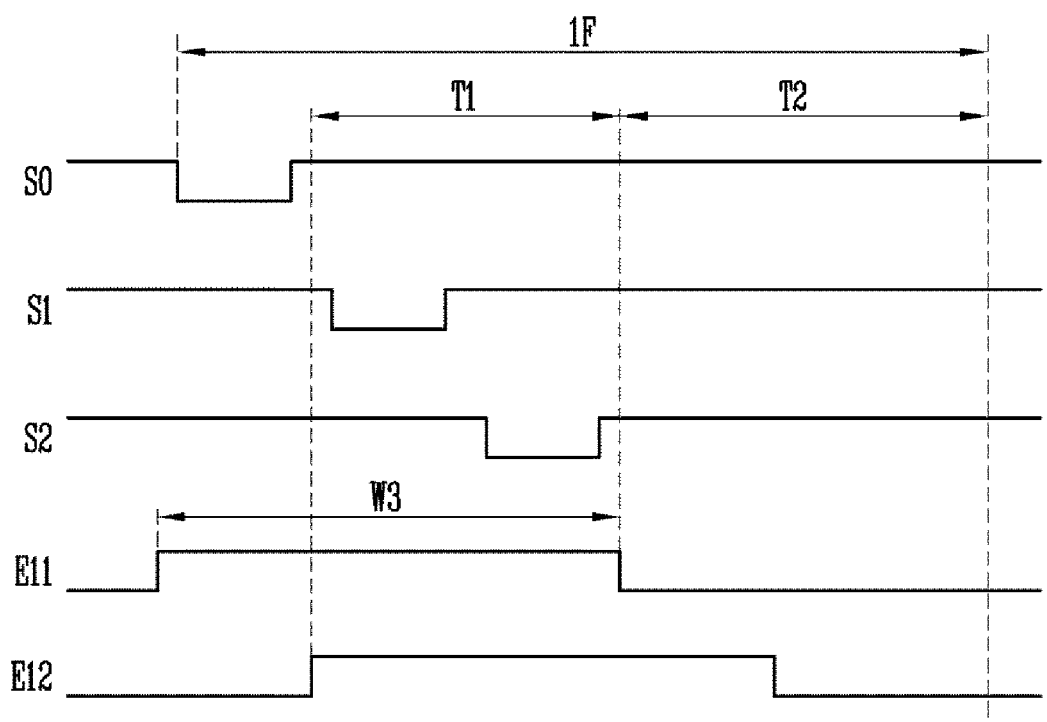

FIG. 8C illustrates still another example of the drive method of the first pixel of FIG. 7. FIG. 8C illustrates a case where the light emission control signal with the third width W3, which is longer than the second width W2 and shorter than the first width W1, is supplied to the first light emission control line E11 in response to the driving of the IR light source 130.

Referring to FIG. 8C, the light emission control signals with the third width W3 are sequentially supplied to the first light emission control lines E11 and E12. At this time, the light emission control signals which are supplied to the first light emission control lines E11 and E12 overlap each other during the first period T1 of the period of one frame 1F. Hence, the first pixel PXL1 is set to be in the non-emission state during the first period T1 of the period of one frame 1F. The IR light source 130 is driven during the first period T1 of the period of one frame 1F.

In addition, the first pixels PXL1 are sequentially driven in response to the data signals during the second period T2 of the period of one frame 1F. That is, in still another example of the present disclosure, the first pixel PXL1 is set to be in the non-emission state during the first period T1 of the period of one frame 1F, and in response to this, the IR light source 130 is driven. In addition, the first pixel PXL1 is driven in response to the data signal during the second period T2 of the period of one frame 1F.

Figure 9:
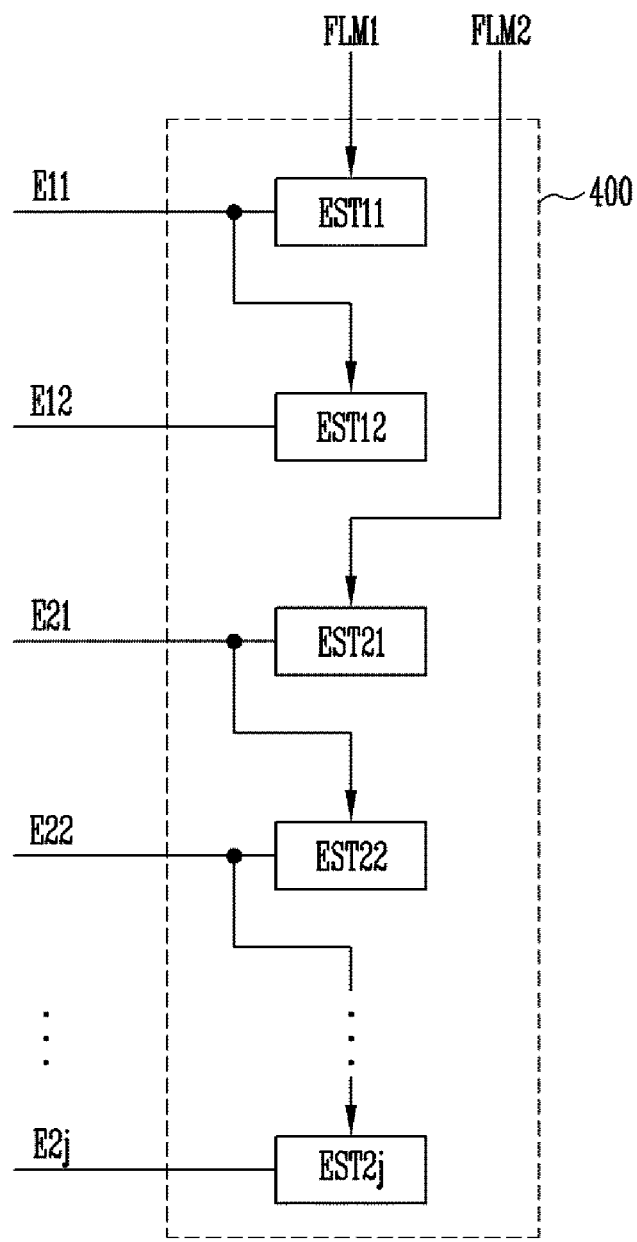
FIG. 9 illustrates an example of a light emission driver of FIG. 3.

FIG. 9 illustrates an example of the light emission driver of FIG. 3. Stages EST11, EST12, and EST21 to EST2j of FIG. 9 have circuit structures in which widths of the light emission control signals are controlled in response to start signals FLM1 and FLM2. The stages EST11, EST12, and EST21 to EST2j may be configured by known various circuits which control the widths of the light emission control signals corresponding to widths of the start signals FLM1 and FLM2.

In addition, the stages EST11, EST12, and EST21 to EST2j generate the light emission control signals with a width which is the same as or similar to the widths of the start signals FLM1 and FLM2. Hereinafter, the stages EST11, EST12, and EST21 to EST2j are assumed to generate the light emission control signals with the same width as widths of the start signals FLM1 and FLM2 for the sake of convenient description.

Referring to FIG. 9, the light emission driver 400 according to the example of the present disclosure includes the first light emission stages EST11 and EST12 and the second light emission stages EST21 to EST2j.

The first light emission stages EST11 and EST12 are respectively connected to the first light emission control lines E11 and E12. The first light emission stages EST11 and EST12 are driven by the first start signal FLM1. In other words, the first light emission stage EST11 outputs the light emission control signal in response to the first start signal FLM1. In addition, the second light emission stage EST12 receives an output signal (that is, the light emission control signal) of the first light emission stage EST11, and outputs the light emission control signal in response to the received output signal.

Additionally, the widths of the light emission control signals which are supplied from the first light emission stages EST11 and EST12 are determined in response to the first start signal FLM1. That is, if the first start signal FLM1 with the first width W1 is supplied, the light emission control signals with the first width W1 are supplied to the first light emission control lines E11 and E12. In addition, if the first start signal FLM1 with the second width W2 is supplied, the light emission control signals with the second width W2 are supplied to the first light emission control lines E11 and E12. In the same manner, if the first start signal FLM1 with the third width W3 is supplied, the light emission control signals with the third width W3 are supplied to the first light emission control lines E11 and E12.

The first start signal FLM1 may be supplied from the timing controller 500. The timing controller 500 supplies the first start signal FLM1 corresponding to the second width W2 during the period when the IR light source 130 is not driven. In addition, the timing controller 500 may supply the first start signal FLM1 with the first width W1 or the third width W3 in response to driving of the IR light source 130.

The second light emission stages EST21 to EST2j are respectively connected to the second light emission control lines E21 to E2j. The second light emission stages EST21 to EST2j are driven in response to the second start signal FLM2. In other words, the head stage EST21 outputs the light emission control signal in response to the second start signal FLM2, and the remaining light emission stages EST22 to EST2j respectively receive output signals of previous stages thereof and outputs the light emission control signal.

The timing controller 500 outputs the second start signal FLM2 with the second width W2 regardless of the driving of the IR light source 130. Then, the second light emission stages EST21 to EST2j sequentially supply the light emission control signals with the second width W2 to the second light emission control lines E21 to E2j.

Meanwhile, FIG. 9 illustrates that two start signals FLM1 and FLM2 are supplied to the light emission driver 400 in response to two display areas 110 and 120, but the present disclosure is not limited to this. As an example, if the display panel 100 includes k (k is a natural number larger than or equal to 2) display areas, the light emission driver 400 may be driven by k start signals FLM1 to FLMk.

Figure 10A:
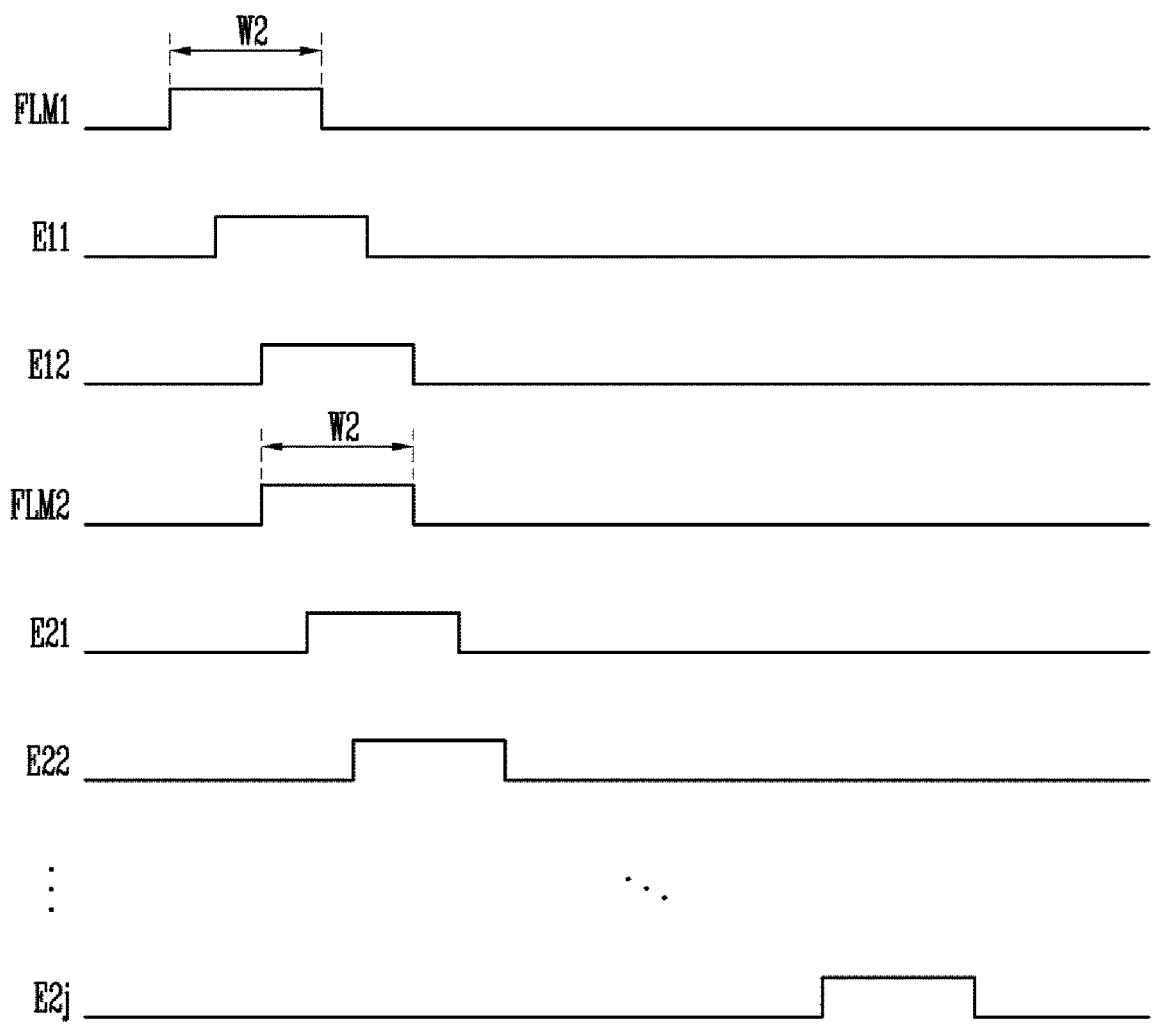
FIGS. 10A, 10B and 10C illustrate a drive method of the light emission driver of FIG. 9.

FIG. 10A illustrates an example of a drive method of the light emission driver of FIG. 9. FIG. 10A illustrates a case where the IR light source 130 is not driven and thereby the light emission control signals with the second width W2 are supplied to the first light emission control lines E11 and E12.

Referring to FIG. 10A, the timing controller 500 supplies the first start signal FLM1 with the second width W2 and the second start signal FLM2 with the second width W2 to the light emission driver 400. Here, supplying timing of the first start signal FLM1 and the second start signal FLM2 may be controlled such that the light emission control signals are sequentially supplied to the first light emission control lines E11 and E12 and the second light emission control lines E21 to E2j.

If the first start signal FLM1 with the second width W2 is supplied, the first light emission stages EST11 and EST12 sequentially supply the light emission control signals with the second width W2 to the first light emission control lines E11 and E12.

If the second start signal FLM2 with the second width W2 is supplied, the second light emission stages EST21 to EST2j sequentially supply the light emission control signals with the second width W2 to the second light emission control lines E21 to E2j. Then, an image with predetermined luminance is displayed in the first display area 110 and the second display area 120.

Figure 10B:
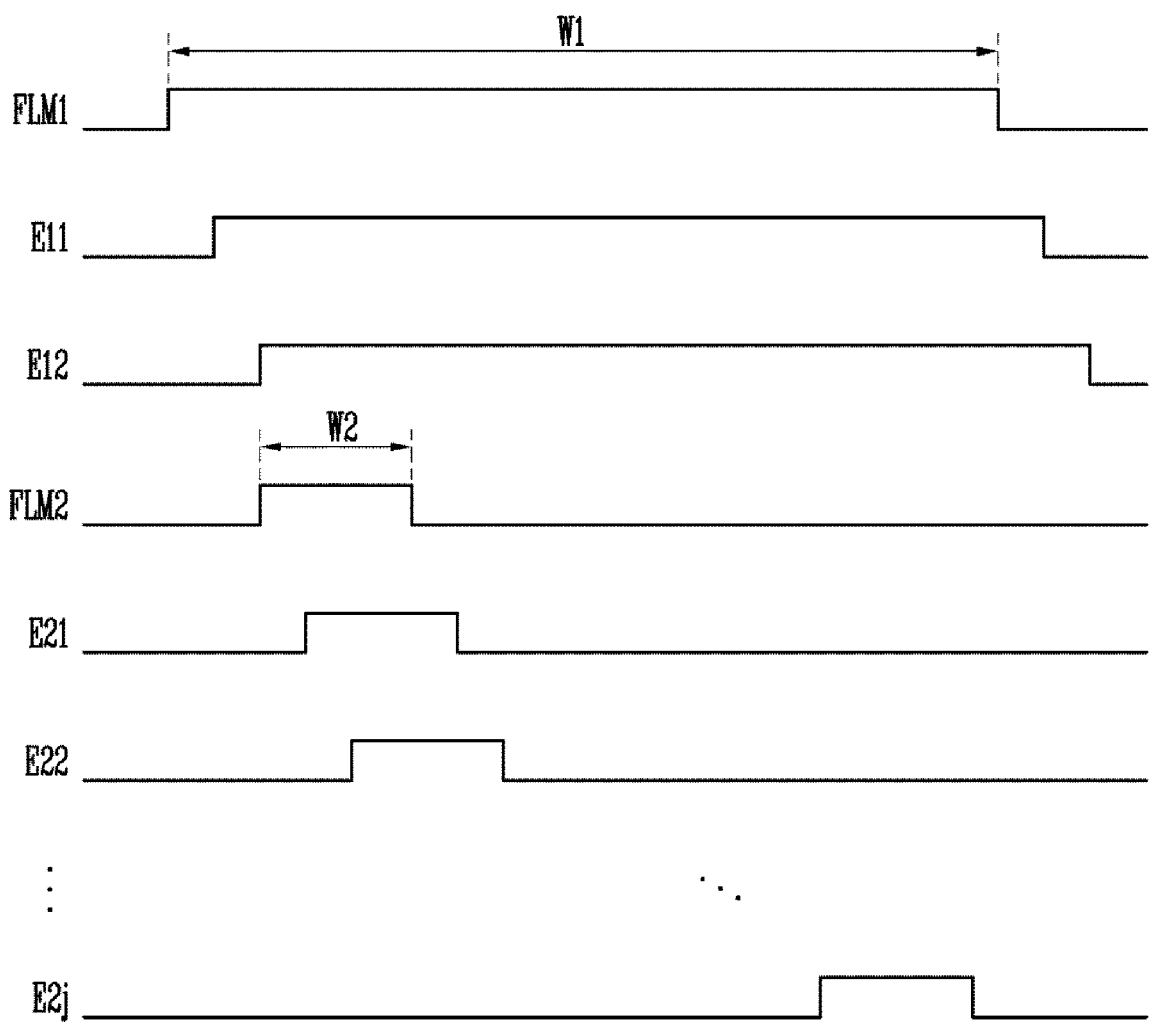

FIG. 10B illustrates another example of the drive method of the light emission driver of FIG. 9. FIG. 10B illustrates a case where the light emission control signals with the first width W1 are supplied to the first light emission control lines E11 and E12.

Referring to FIG. 10B, the timing controller 500 supplies the first start signal FLM1 with the first width W1 and the second start signal FLM2 with the second width W2.

The first light emission stages EST11 and EST12 which receive the first start signal FLM1 supply the light emission control signals with the first width W1 to the first light emission control lines E11 and E12. Then, the first pixels PXL1 connected to the first light emission control lines E11 and E12 are set to be in a non-emission state during the period of one frame.

The second light emission stages EST21 to EST2j which receive the second start signal FLM2 supply the light emission control signals with the second width W2 to the second light emission control lines E21 and E2j. Then, the second pixels PXL2 connected to the second light emission control lines E21 to E2j display a predetermined image in response to the data signal.

Figure 10C:
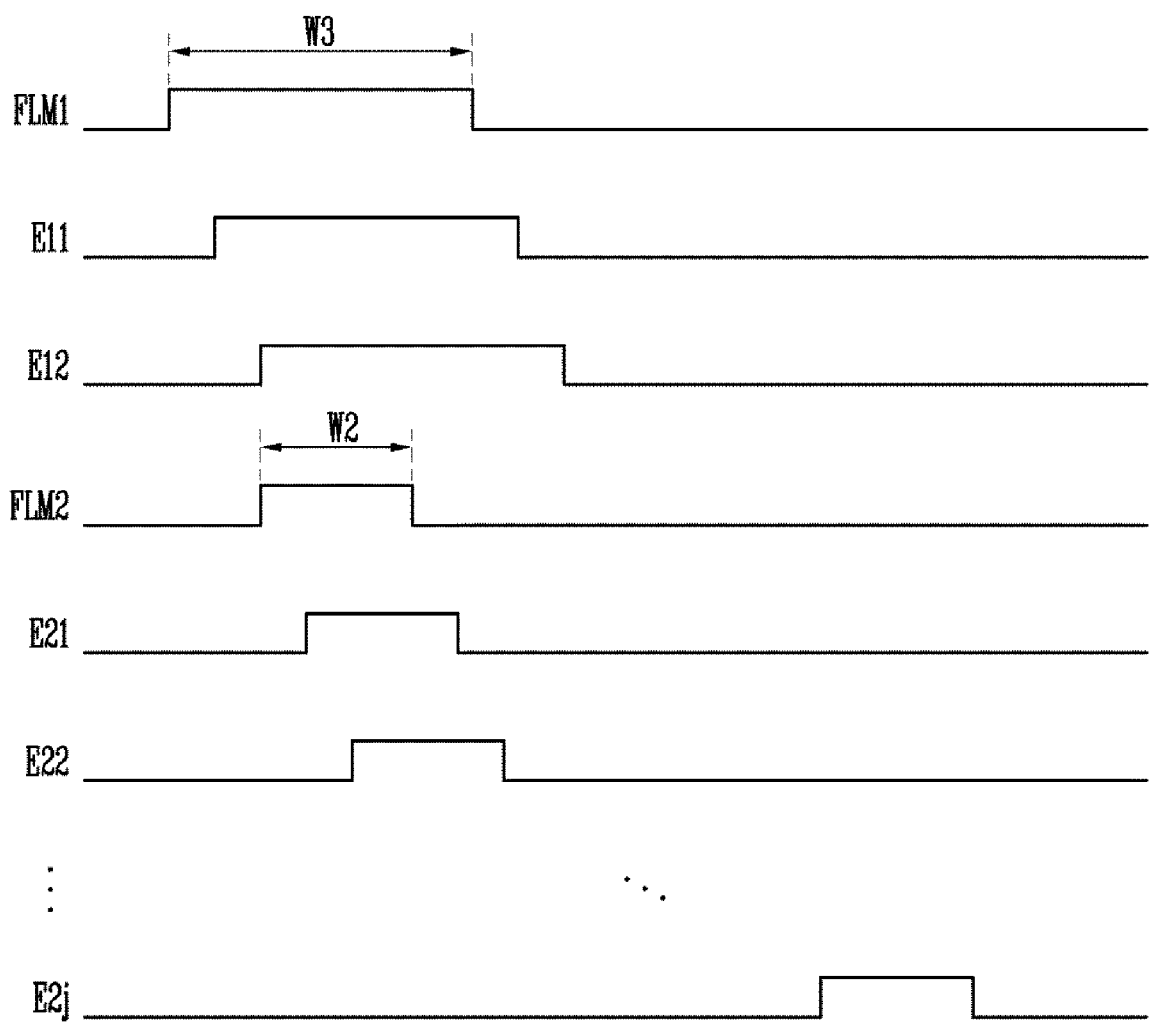

FIG. 10C illustrates still another example of the drive method of the light emission driver of FIG. 9. FIG. 10C illustrates a case where the light emission control signals with the third width W3 are supplied to the first light emission control lines E11 and E12.

Referring to FIG. 10C, the timing controller 500 supplies the first start signal FLM1 with the third width W3 and the second start signal FLM2 with the second width W2.

The first light emission stages EST11 and EST12 which receive the first start signal FLM1 supply the light emission control signals with the third width W3 to the first light emission control lines E11 and E12.

The second light emission stages EST21 to EST2j which receive the second start signal FLM2 supply the light emission control signals with the second width W2 to the second light emission control lines E21 and E2j. Then, the second pixels PXL2 connected to the second light emission control lines E21 to E2j display a predetermined image in response to the data signal.

FIG. 11 illustrates another example of the light emission driver of FIG. 3.

Referring to FIG. 11, the light emission driver 400 according to another example of the present disclosure includes the first light emission stages EST11 and EST12 and the second light emission stages EST21 to EST2j.

The first light emission stages EST11 and EST12 are respectively connected to the first light emission control lines E11 and E12. The first light emission stages EST11 and EST12 are driven by the first start signal FLM1. In other words, the first light emission stage EST11 outputs the light emission control signal in response to the first start signal FLM1. In addition, the second light emission stage EST12 outputs the light emission control signal in response to an output signal (that is, the light emission control signal) of the first light emission stage EST11.

The second light emission stages EST21 to EST2j are respectively connected to the second light emission control lines E21 to E2j. The second light emission stages EST21 to EST2j are driven in response to the second start signal FLM2. In other words, a first stage EST21 of the second light emission stages outputs the light emission control signal in response to the second start signal FLM2, and the other stages EST22 to EST2j respectively receive output signals of the second light emission stages EST2 of previous stage, thereby outputting the light emission control signals.

If the IR light source 130 is not driven, the timing controller 500 supplies the first start signal FLM1 with the second width W2 and the second start signal FLM2 with the second width W2. In this case, the first light emission stages EST11 and EST12 and the second light emission stages EST21 to EST2j sequentially supply the light emission control signals to the first light emission control lines E11 and E12 and the second light emission control lines E21 to E2j.

Figure 12A:
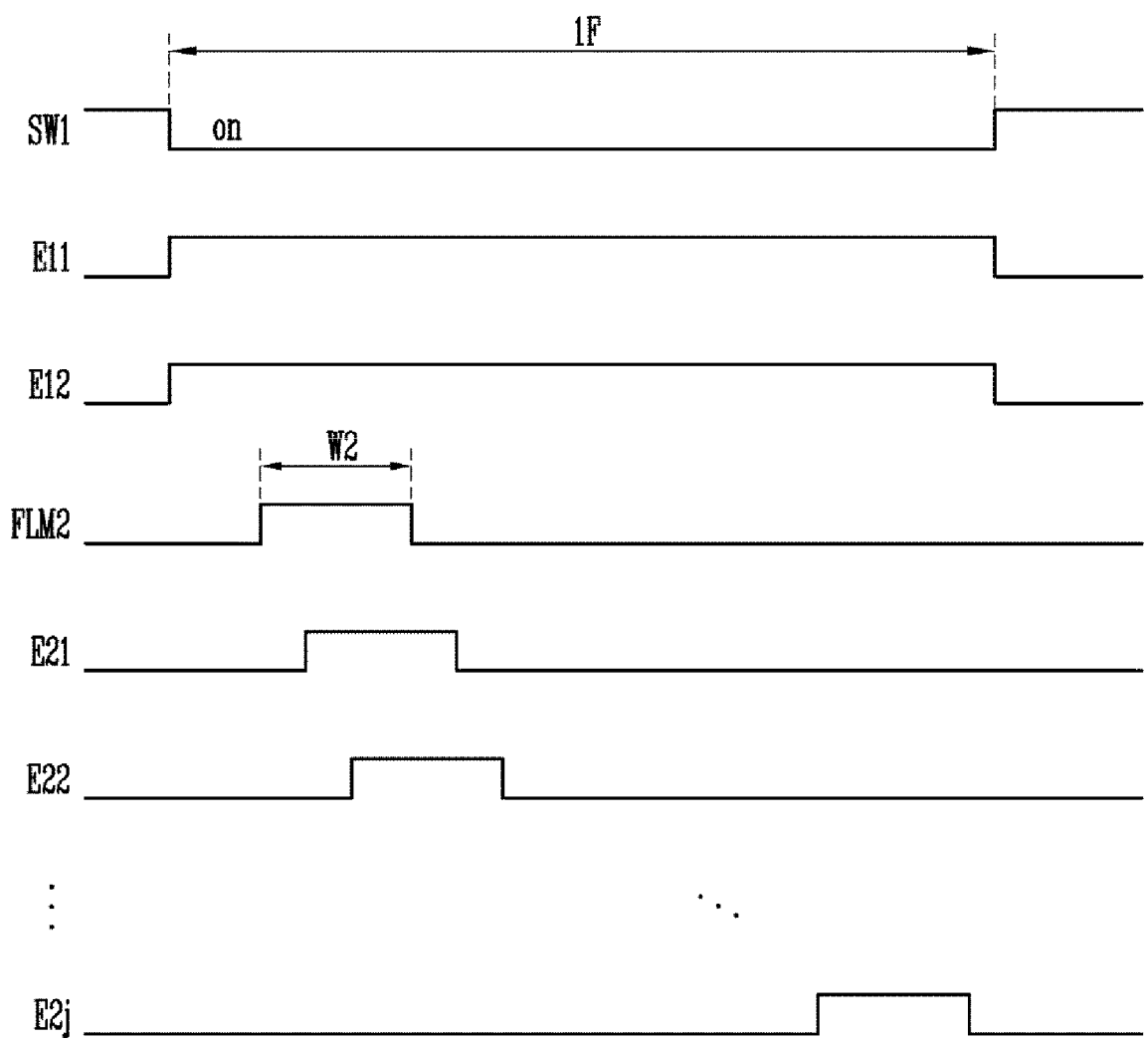
FIGS. 12A and 12B illustrate a drive method of the light emission drive of FIG. 11.
Figure 12B:
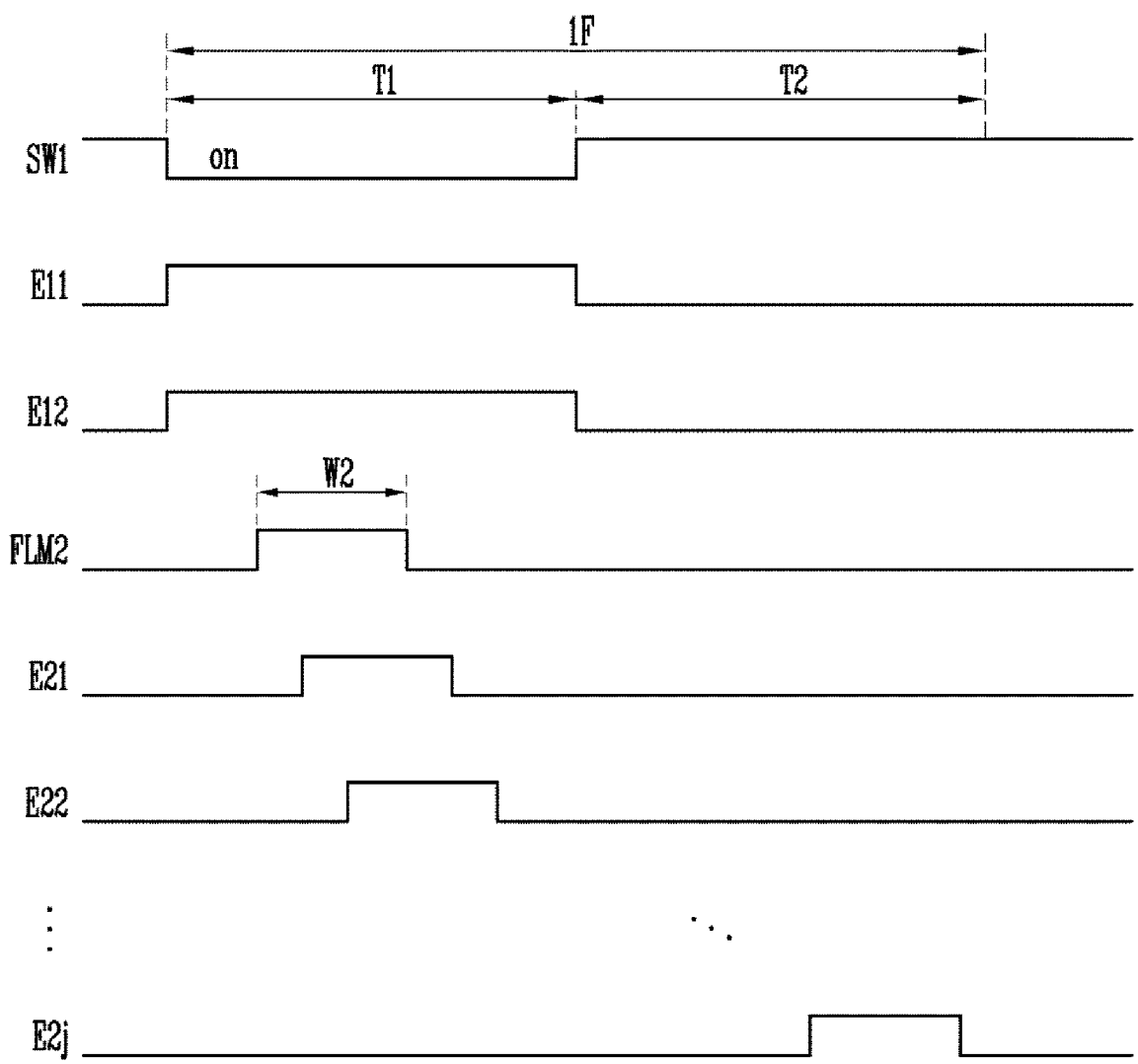

In addition, if the IR light source 130 is driven, the timing controller 500 supplies the second start signal FLM2 with the second width W2 as illustrated in FIG. 12A and FIG. 12B. In this case, the second light emission stages EST21 to EST2j sequentially supply the light emission control signals to the second light emission control lines E21 to E2j. In addition, if the IR light source 130 is driven, the timing controller 500 does not supply the first start signal FLM1.

Meanwhile, the light emission driver 400 according to another example of the present disclosure further includes first switches SW1 which are connected between each of the first light emission control lines E11 and E12 and a reference power supply Vref. Here, the reference power supply Vref is set to a voltage which can turn off a transistor, which is included in the first pixels PXL1, for example, the light emission control transistor ME.

The first switches SW1 are turned on or turned off in response to control of the timing controller 500. The first switches SW1 are set to be turned on during the period when the IR light source 130 is driven. If the first switches SW1 are turned on, a voltage of the reference power supply Vref is supplied to the first light emission control lines E11 and E12. If the voltage of the reference power supply Vref is supplied to the first light emission control lines E11 and E12, the light emission control transistors ME included in the first pixels PXL1 are set to be turned off, and thereby, the first pixels PXL1 are set to be in a non-emission state.

Additionally, the timing controller 500 may turn on the first switches SW1 during the period of one frame 1F as illustrated in FIG. 12A. In this case, the IR light source 130 is driven during the period of one frame 1F.

In addition, the timing controller 500 may turn on the first switches SW1 during the first period T1 of the period of one frame 1F, and may turn off the first switches SW1 during the second period T2. Then, the IR light source 130 is driven during the first period T1, and is not driven during the second period T2.

Figure 13A:
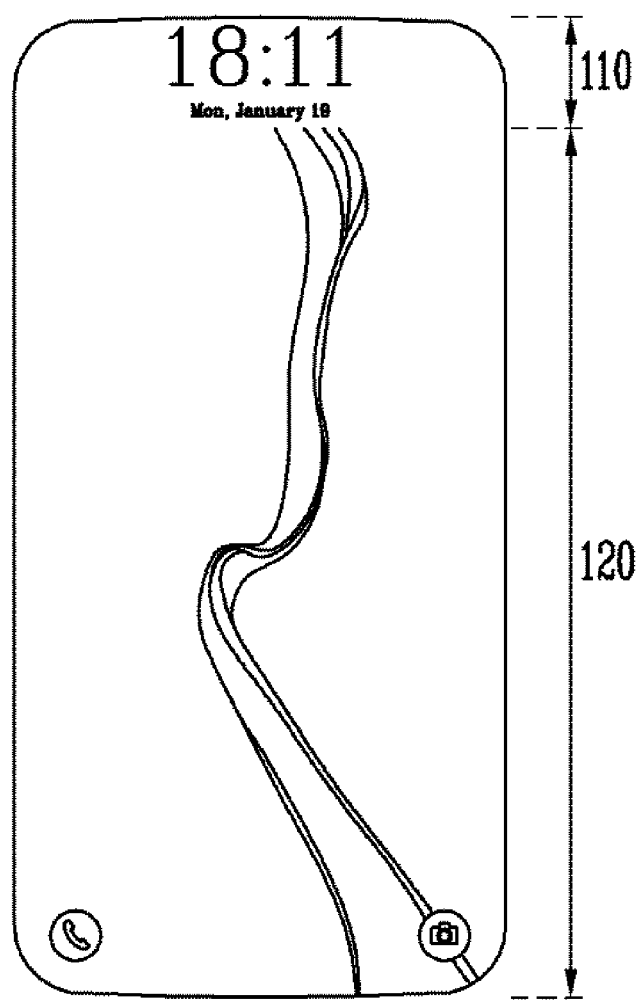
FIG. 13A illustrates an image being displayed on the display device when an IR light source is not driven.

FIG. 13A illustrates an image being displayed on the display device when the IR light source is not driven.

Referring to FIG. 13A, If the IR light source 130 is not driven, the first pixels PXL1 and the second pixels PXL2 display a predetermined image in response to the data signal. According to a display device and a driving method thereof of embodiments of the present disclosure, IR light source 130 is disposed in a pixel area, and thus, it is possible to minimize a dead space.

Figure 13B:
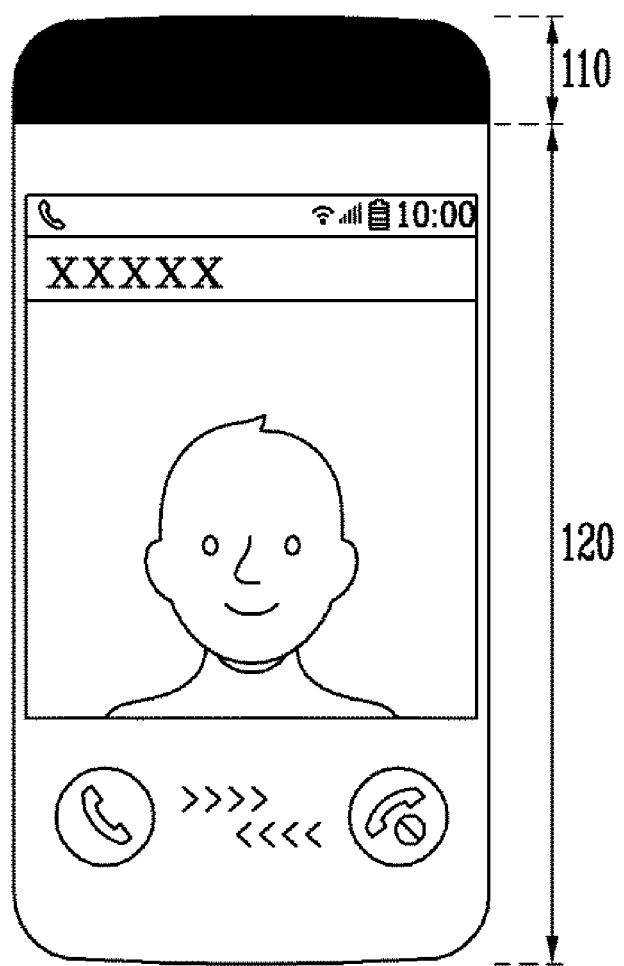
FIG. 13B illustrates an image being displayed on the display device when the IR light source is driven.

FIG. 13B illustrates an image being displayed on the display device when the IR light source is driven.

Referring to FIG. 13A, if the IR light source 130 is included in a proximity sensor, the IR light source 130 is driven during a phone call. If the IR light source 130 is driven, the first pixels PXL1 included in the first display area 110 are set to be in the non-emission state. In addition, the second pixels PXL2 included in the second display area 120 display a predetermined image in response to the data signal regardless of the IR light source 130.

Meanwhile, if the first pixels PXL1 are set to be in the non-emission state, it is possible to prevent an abnormal light emission phenomenon from occurring in the first display area 110 when the IR light source 130 is driven. That is, in the present embodiment of the present disclosure, when the IR light source 130 is driven, the first display area 110 is set to be in the non-emission state, and thus, display quality may be improved.

Figure 14:
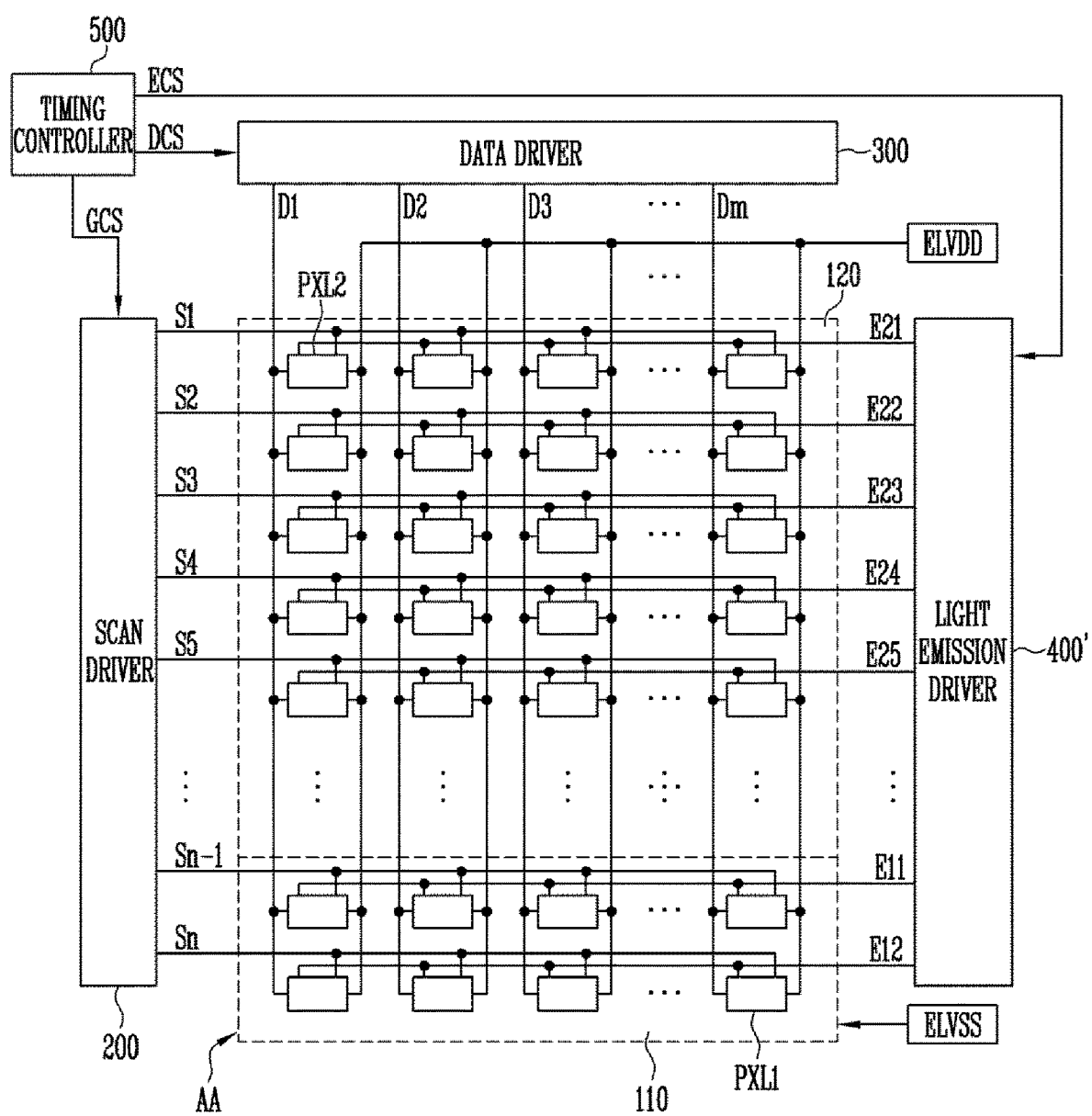
FIG. 14 illustrates a display device including the display panel of FIG. 1B.

FIG. 14 illustrates an embodiment of a display device including the display panel of FIG. 1B. In FIG. 14, the same symbols or reference numerals are attached to constituents functionally similar to constituent s of FIG. 3.

Referring to FIG. 14, the display device according to the embodiment of the present disclosure includes the scan driver 200, the data driver 300, a light emission driver 400', and the timing controller 500.

The first pixels PXL1 are disposed in the first display area 110 so as to be connected to scan lines Sn−1 and Sn, the first light emission control lines E11 and E12, and data lines D1 to Dm. When the scan signals are supplied from the scan lines Sn−1 and Sn, the first pixels PXL1 receive the data signals from the data lines D1 to Dm. The first pixels PXL1 received the data signals control the amount of current flowing from the first power supply ELVDD to the second power supply ELVSS through an organic light emitting diode (not illustrated). The first pixels PXL1 control light emission time in response to the light emission control signals which are supplied from the first light emission control lines E11 and E12.

The first pixels PXL1 are set to be in the non-emission state during the period when the IR light source 130 is driven. For this, the light emission driver 400' supplies the light emission control signals to the first light emission control lines E11 and E12 such that the first pixels PXL1 are set to be in the non-emission state during the period when the IR light source 130 is driven.

As an example, the light emission driver 400' may supply the light emission control signals to the first light emission control lines E11 and E12 such that the first pixels PXL1 are set to be in the non-emission state during the first period of the period of one frame 1F in response to the driving of the IR light source 130.

In addition, the light emission driver 400 may supply the light emission control signals to the first light emission control lines E11 and E12 such that the first pixels PXL1 do not emit light during the period of one frame in response to the driving of the IR light source 130.

Meanwhile, FIG. 14 illustrates that the first pixels PXL1 are disposed in two horizontal lines for the sake of convenient description, but the present disclosure is not limited to this. As an example, the first pixels PXL1 may be disposed in one horizontal line, and the number of the scan lines Sn−1 and Sn and the first light emission control lines E11 and E12 which are formed in the first display area 110 in response to the disposition of the first pixels PXL1 may be changed.

The second pixels PXL2 are disposed in the second display area 120 so as to be connected to scan lines S1, S2, . . . , second light emission control lines E21, E22, . . . , and the data lines D1 to Dm. When the scan signals are supplied to the scan lines S1, S2, . . . , the second pixels PXL2 receive the data signals from the data lines D1 to Dm. The second pixels PXL2 received the data signals control the amount of current flowing from the first power supply ELVDD to the second power supply ELVSS through an organic light emitting diode (not illustrated). The second pixels PXL2 control light emission time in response to light emission control signals which are supplied from the second light emission control lines E21, E22, . . . .

The scan driver 200 supplies the scan signals to the scan lines S1 to Sn in response to the gate control signal GCS output from the timing controller 500. As an example, the scan driver 200 may sequentially supply the scan signals to the scan lines S1 to Sn. If the scan signals are sequentially supplied to the scan lines S1 to Sn, the first pixels PXL1 and the second pixels PXL2 are sequentially selected one horizontal line at a time.

The light emission driver 400' supplies the light emission control signals to the second light emission control lines E21, E22, . . . , and the first light emission control lines E11 and E12 in response to the emission control signal ECS output from the timing controller 500. As an example, the light emission driver 400' may sequentially supply the light emission control signals to the second light emission control lines E21, E22, . . . , and the first light emission control lines E11 and E12.

During the period when the IR light source 130 is not driven, the light emission driver 400' may sequentially supply the light emission control signals with the second width W2 to the first light emission control lines E11 and E12 and the second light emission control lines E21, E22, . . . .

In addition, the light emission driver 400' may supply the light emission control signals with the first width W1 to the first light emission control lines E11 and E12 during the period when the IR light source 130 is driven. If the light emission control signals with the first width W1 are supplied, the first pixels PXL1 may be set to be in the non-emission state during the period of one frame.

In addition, the light emission driver 400' may supply light emission control signals with a third width W3 to the first light emission control lines E11 and E12 in response to the driving of the IR light source 130. The light emission control signals with the third width W3 are set such that the first pixels PXL1 disposed in the first display area 110 do not emit light during the first period of the period of one frame 1F. The first pixels PXL1 receiving the light emission control signals with the third width W3 do not emit light during the first period T1 of the period of one frame, and are driven in response to the data signals during the second period T2. At this time, the IR light source 130 is driven during the first period T1 of the period of one frame 1F.

The data driver 300 supplies the data signals to the data lines D1 to Dm in response to the data control signal DCS. The data signals which are supplied to the data lines D1 to Dm are supplied to the pixels PXL1 and PXL2 which are selected by the scan signals.

The timing controller 500 generates the gate control signal GCS, the emission control signal ECS, and the data control signal DCS, bases on timing signals which are supplied from the outside, for example, a graphic controller (not illustrated). The gate control signal GCS which is generated by the timing controller 500 is supplied to the scan driver 200, and the emission control signal ECS is supplied to the light emission driver 400'. In addition, the data control signal DCS which is generated by the timing controller 500 is supplied to the data driver 300.

Figure 15:
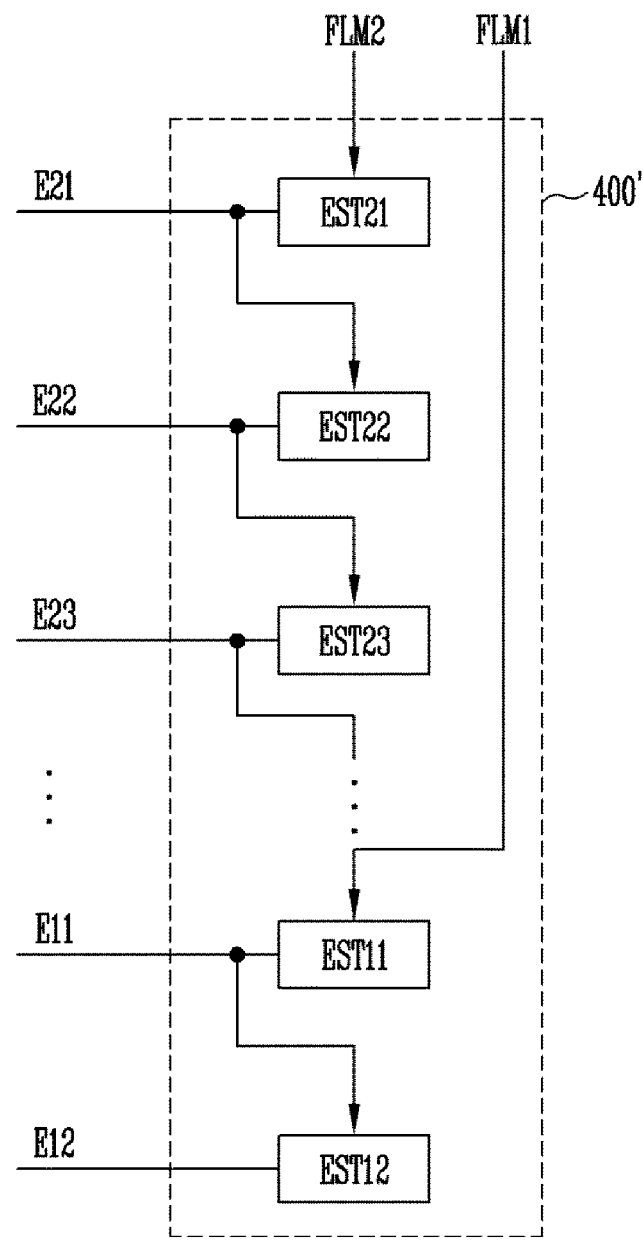
FIG. 15 illustrates an example of a light emission driver of FIG. 14.

FIG. 15 illustrates an example of a light emission driver of FIG. 14. The light emission driver of FIG. 15 has only different positions of light emission stages from those of FIG. 9, and actual configuration thereof is the same as the light emission driver of FIG. 9. Hence, operations of the light emission stages will be briefly described.

Referring to FIG. 15, the light emission driver 400' according to the example of the present disclosure includes the first light emission stages EST11 and EST12 and the second light emission stages EST21, EST22, . . . .

The first light emission stages EST11 and EST12 are respectively connected to the first light emission control lines E11 and E12. The first light emission stages EST11 and EST12 are driven by the first start signal FLM1. In other words, the first light emission stage EST11 outputs the light emission control signal in response to the first start signal FLM1. In addition, the second light emission stage EST12 receives an output signal (that is, the light emission control signal) of the first light emission stage EST11, and outputs the light emission control signal in response to the received output signal.

Additionally, the widths of the light emission control signals which are supplied from the first light emission stages EST11 and EST12 are determined in response to the first start signal FLM1. That is, if the first start signal FLM1 with the first width W1 is supplied, the light emission control signals with the first width W1 are supplied to the first light emission control lines E11 and E12. In addition, if the first start signal FLM1 with the second width W2 is supplied, the light emission control signals with the second width W2 are supplied to the first light emission control lines E11 and E12. In the same manner, if the first start signal FLM1 with the third width W3 is supplied, the light emission control signals with the third width W3 are supplied to the first light emission control lines E11 and E12.

The second light emission stages EST21, EST22, ... are respectively connected to the second light emission control lines E21, E22, ..... The second light emission stages EST21, EST22, ... are driven in response to the start signal FLM2. In other words, the head stage EST21 outputs the light emission control signal in response to the second start signal FLM2, and the remaining light emission stages EST22, ... respectively receive output signals of previous stages thereof and outputs the light emission control signals.

Figure 16:
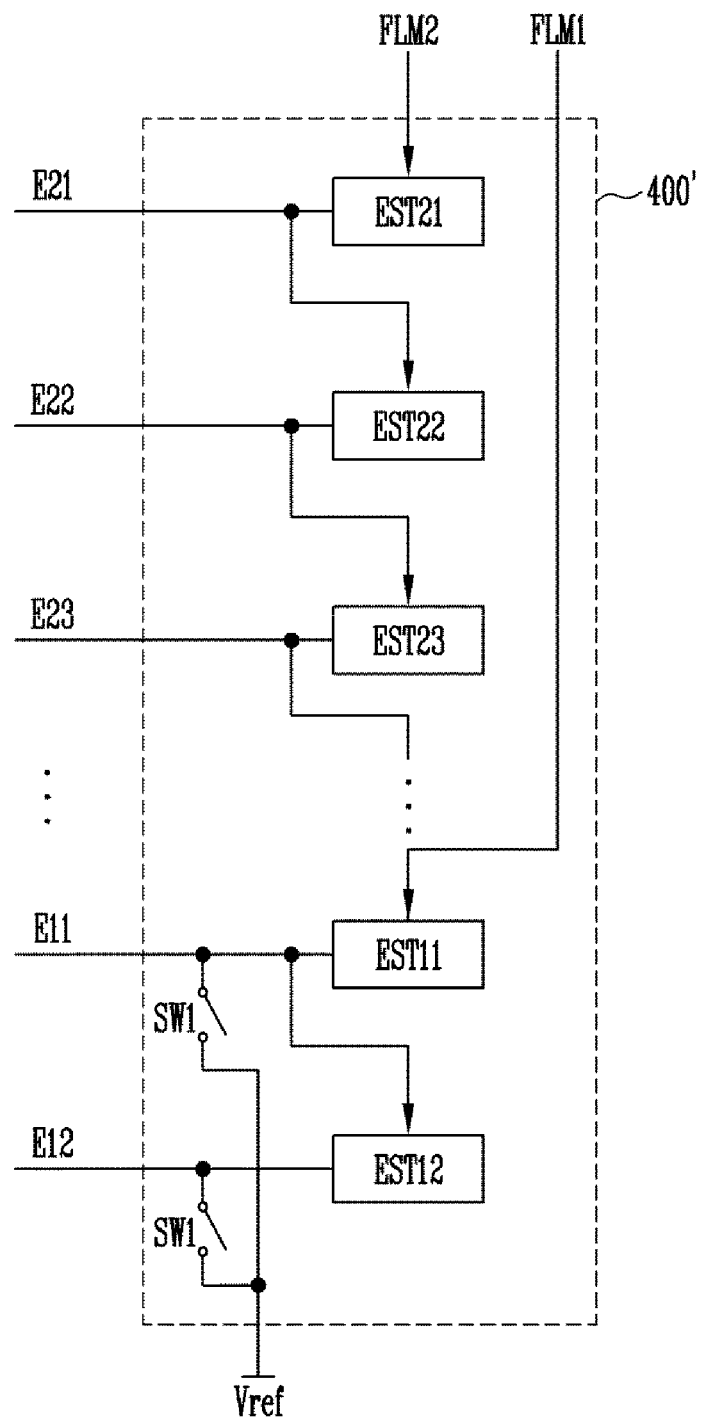
FIG. 16 illustrates another example of the light emission drive of FIG. 14.

FIG. 16 illustrates another example of the light emission driver of FIG. 14. The light emission driver of FIG. 16 has only different positions of light emission stages from those of FIG. 11, and actual configuration thereof is the same as the light emission driver of FIG. 11. Hence, operations of the light emission stages will be briefly described.

Referring to FIG. 16, the light emission driver 400' according to another example of the present disclosure includes the first light emission stages EST11 and EST12 and the second light emission stages EST21, EST22, .....

The first light emission stages EST11 and EST12 are respectively connected to the first light emission control lines E11 and E12. The first light emission stages EST11 and EST12 are driven by the first start signal FLM1.

The second light emission stages EST21, EST22, ... are respectively connected to the second light emission control lines E21, E22, ..... The second light emission stages EST21, EST22, ... are driven in response to the second start signal FLM2.

If the IR light source 130 is not driven, the timing controller 500 supplies the first start signal FLM1 with the second width W2 and the second start signal FLM2 with the second width W2. In this case, the first light emission stages EST11 and EST12 and the second light emission stages EST21, EST22, ... sequentially supply the light emission control signals to the second light emission control lines E21, E22, ... and the first light emission control lines E11 and E12.

In addition, if the IR light source 130 is driven, the timing controller 500 supplies the second start signal FLM2 with the second width W2 as illustrated in FIG. 12A and FIG. 12B. In this case, the second light emission stages EST21, EST22, ... sequentially supply the light emission control signals to the second light emission control lines E21, E22, ..... In addition, if the IR light source 130 is driven, the timing controller 500 does not supply the first start signal FLM1.

Meanwhile, the light emission driver 400' according to another example of the present disclosure further includes first switches SW1 which are connected between each of the first light emission control lines E11 and E12 and a reference power supply Vref.

The first switches SW1 are turned on or turned off in response to control of the timing controller 500. The first switches SW1 are set to be turned on during the period when the IR light source 130 is driven. If the first switches SW1 are turned on, a voltage of the reference power supply Vref is supplied to the first light emission control lines E11 and E12. If the voltage of the reference power supply Vref is supplied to the first light emission control lines E11 and E12, the light emission control transistors ME included in the first pixels PXL1 are set to be turned off, and thereby, the first pixels PXL1 are set to be in a non-emission state.

Additionally, the timing controller 500 may turn on the first switches SW1 during the period of one frame 1F as illustrated in FIG. 12A. In this case, the IR light source 130 is driven during the period of one frame 1F.

In addition, the timing controller 500 may turn on the first switches SW1 during the first period T1 of the period of one frame 1F and may turn off the first switches SW1 during the second period T2. Then, the IR light source 130 is driven during the first period T1, and is not driven during the second period T2.

Figure 17:
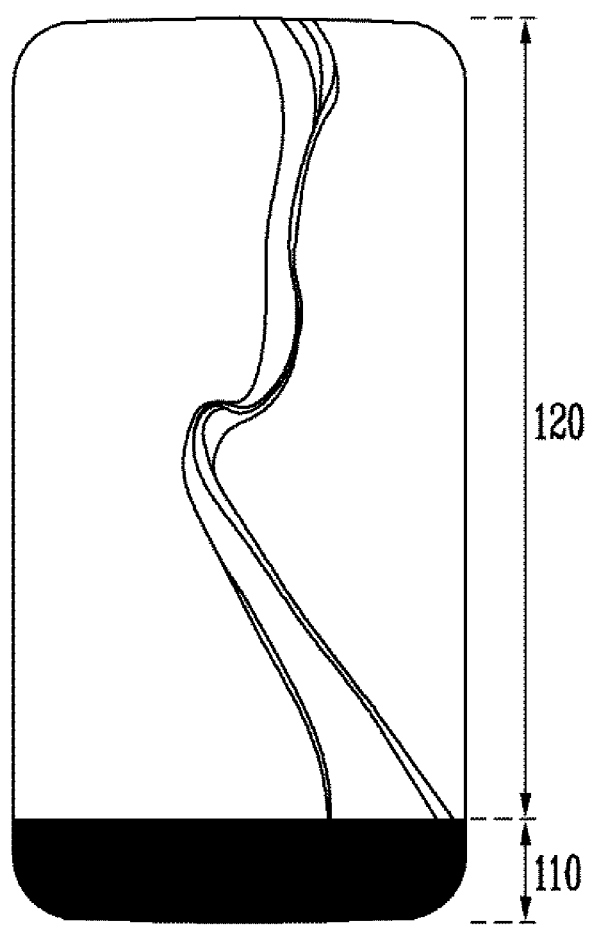
FIG. 17 illustrates another image being displayed on the display device when the IR light source is driven.

FIG. 17 illustrates an image being displayed on the display device when the IR light source is driven during the period of one frame.

In FIG. 17, if the IR light source 130 is included in a fingerprint sensor, the IR light source 130 is driven when the fingerprint sensor operates. If the IR light source 130 is driven, the first pixels PXL1 included in the first display area 110 are set to be in the non-emission state. In addition, the second pixels PXL2 included in the second display area 120 display a predetermined image in response to the data signal regardless of the IR light source 130.

Meanwhile, if the first pixels PXL1 are set to be in the non-emission state, it is possible to prevent an abnormal light emission phenomenon from occurring in the first display area 110 when the IR light source 130 is driven. That is, in the present embodiment of the present disclosure, when the IR light source 130 is driven, the first display area 110 is set to be in the non-emission state, and thus, display quality may be improved.

Figure 18:
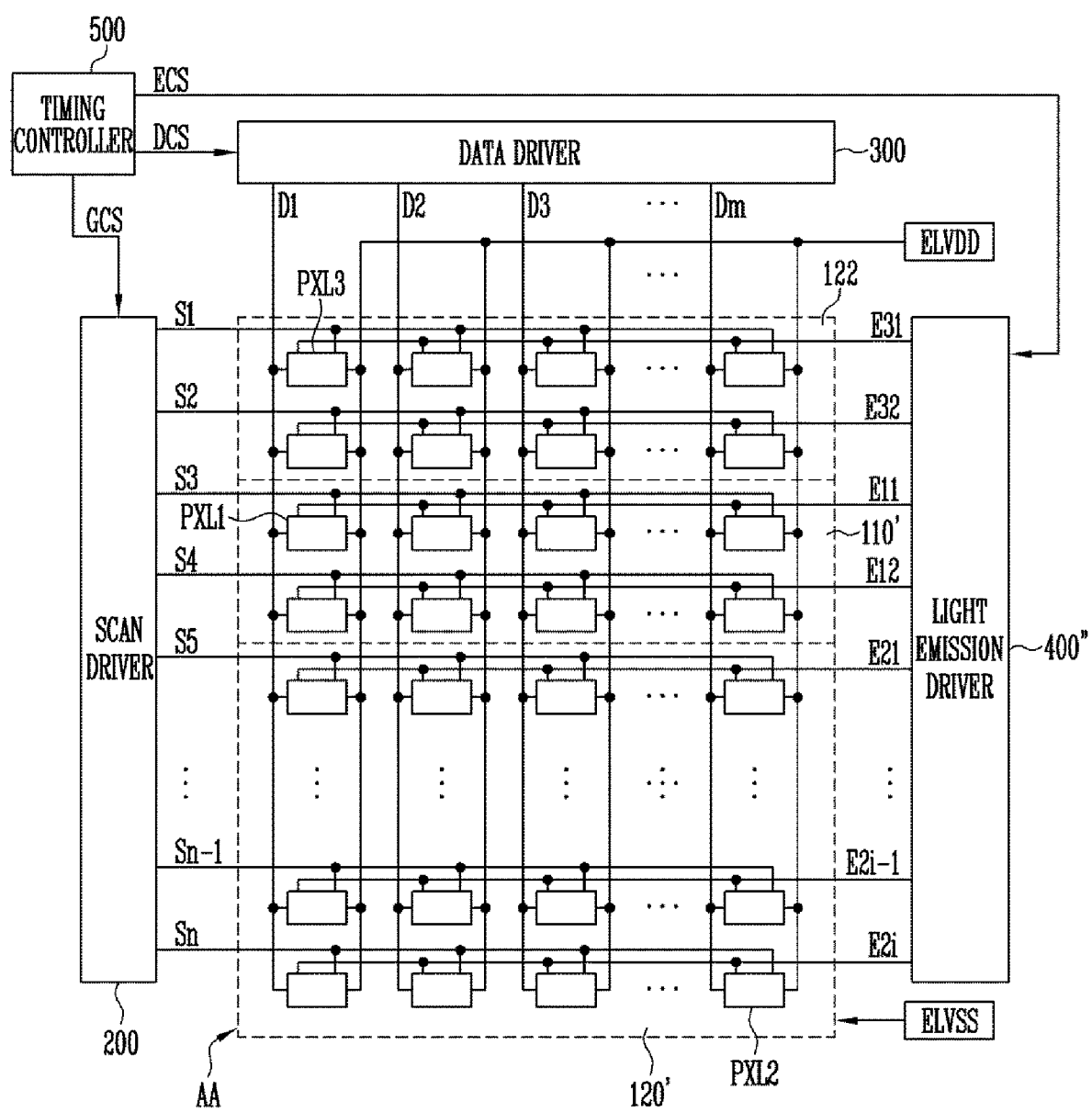
FIG. 18 illustrates a display device including the display panel of FIG. 2.

FIG. 18 illustrates a display device including the display panel of FIG. 2. In FIG. 18, the same symbols or reference numerals are attached to configurations functionally similar to configurations of FIG. 3.

Referring to FIG. 18, the display device according to the embodiment of the present disclosure includes the scan driver 200, the data driver 300, a light emission driver 400", and the timing controller 500.

The first pixels PXL1 are disposed in the first display area 110' so as to be connected to scan lines S3 and S4, the first light emission control lines E11 and E12, and data lines D1 to Dm. When the scan signals are supplied from the scan lines S3 and S4, the first pixels PXL1 receive the data signals from the data lines D1 to Dm. The first pixels PXL1 received the data signals control the amount of current flowing from the first power supply ELVDD to the second power supply ELVSS through an organic light emitting diode (not illustrated). The first pixels PXL1 control light emission time in response to the light emission control signals which are supplied from the first light emission control lines E11 and E12.

The first pixels PXL1 are set to be in the non-emission state during the period when the IR light source 130 is driven. For this, the light emission driver 400" supplies the light emission control signals to the first light emission control lines E11 and E12 such that the first pixels PXL1 are set to be in the non-emission state during the period when the IR light source 130 is driven.

Meanwhile, FIG. 18 illustrates that the first pixels PXL1 are disposed in two horizontal lines for the sake of convenient description, but the present disclosure is not limited to this. As an example, the first pixels PXL1 may be disposed in one horizontal line, and the number of the scan lines S3 and S4 and the first light emission control lines E11 and E12 which are formed in the first display area 110' in response to the disposition of the first pixels PXL1 may be changed.

The second pixels PXL2 are disposed in the second display area 120' so as to be connected to scan lines S5 to Sn, second light emission control lines E21 to E2$i$ (I is a natural number smaller than n), and the data lines D1 to Dm. When the scan signals are supplied to the scan lines S5 to Sn, the second pixels PXL2 receive the data signals from the data lines D1 to Dm. The second pixels PXL2 received the data signals control the amount of current flowing from the first power supply ELVDD to the second power supply ELVSS through an organic light emitting diode (not illustrated). The second pixels PXL2 control light emission time in response to light emission control signals which are supplied from the second light emission control lines E21 to E2$i$.

Third pixels PXL3 are disposed in a third display area 122 so as to be connected to the scan lines S1 and S2, third light emission control lines E31 and E32, and the data lines D1 to Dm. When the scan signals are supplied to the scan lines S1 and S2, the third pixels PXL3 receive the data signals from the data lines D1 to Dm. The third pixels PXL3 received the data signals control the amount of current flowing from the first power supply ELVDD to the second power supply ELVSS through an organic light emitting diode (not illustrated). The third pixels PXL3 control light emission time in response to light emission control signals which are supplied from the third light emission control lines E31 and E32. Additionally, the third pixels PXL3 may be set to have the same circuit structure as the first pixels PXL1. As an example, the third pixels PXL3 may be set to have the circuit structure illustrated in FIG. 4, FIG. 6A, FIG. 6B, or FIG. 7.

Meanwhile, FIG. 18 illustrates that the third pixels PXL3 are disposed in two horizontal lines for the sake of convenient description, but the present disclosure is not limited to this. As an example, the third pixels PXL3 may be disposed in at least one horizontal line, and the number of the scan lines S1 and S2 and the third light emission control lines E31 and E32 which are formed in the third display area 122 in response to the disposition of the third pixels PXL3 may be changed.

The scan driver 200 supplies the scan signals to the scan lines S1 to Sn in response to the gate control signal GCS output from the timing controller 500. As an example, the scan driver 200 may sequentially supply the scan signals to the scan lines S1 to Sn. If the scan signals are sequentially supplied to the scan lines S1 to Sn, the third pixels PXL3, the first pixels PXL1, and the second pixels PXL2 are sequentially selected one horizontal line at a time.

The light emission driver 400" sequentially supplies the light emission control signals to the third light emission control lines E31 and E32, the first light emission control lines E11, E12, and the second light emission control lines E21 to E2$i$ in response to the emission control signal ECS output from the timing controller 500.

During the period when the IR light source 130 is not driven, the light emission driver 400" may sequentially supply the light emission control signals with the second width W2 to the third light emission control lines E31 and E32, the first light emission control lines E11 and E12, and the second light emission control lines E21 to E2$i$. If the light emission control signals with the second width W2 are supplied to the third light emission control lines E31 and E32, the first light emission control lines E11 and E12, and the second light emission control lines E21 to E2$i$, the pixels PXL1, PXL2, and PXL3 display a predetermined image in response to the data signals.

In addition, the light emission driver 400" may supply the light emission control signals with the first width W1 to the first light emission control lines E11 and E12 during the period when the IR light source 130 is driven. If the light emission control signals with the first width W1 are supplied, the first pixels PXL1 may be set to be in the non-emission state during the period of one frame.

In addition, the light emission driver 400" may supply light emission control signals with the third width W3 to the first light emission control lines E11 and E12 in response to the driving of the IR light source 130. The light emission control signals with the third width W3 are set such that the first pixels PXL1 disposed in the first display area 110 do not emit light during the first period of the period of one frame 1F. The first pixels PXL1 receiving the light emission control signals with the third width W3 do not emit light during the first period T1 of the period of one frame, and are driven in response to the data signals during the second period T2. At this time, the IR light source 130 is driven during the first period T1 of the period of one frame 1F.

Additionally, the light emission driver 400" supplies the light emission control signals with the second width W2 to the third light emission control lines E31 and E32, and the second light emission control lines E21 to E2$i$ during the period when the IR light source 130 is driven.

The data driver 300 supplies the data signals to the data lines D1 to Dm in response to the data control signal DCS. The data signals which are supplied to the data lines D1 to Dm are supplied to the pixels PXL1, PXL2, and PXL3 which are selected by the scan signals.

The timing controller 500 generates the gate control signal GCS, the emission control signal ECS, and the data control signal DCS, bases on timing signals which are supplied from the outside, for example, a graphic controller (not illustrated). The gate control signal GCS which is generated by the timing controller 500 is supplied to the scan driver 200, and the emission control signal ECS is supplied to the light emission driver 400". In addition, the data control signal DCS which is generated by the timing controller 500 is supplied to the data drive 300.

Figure 19:
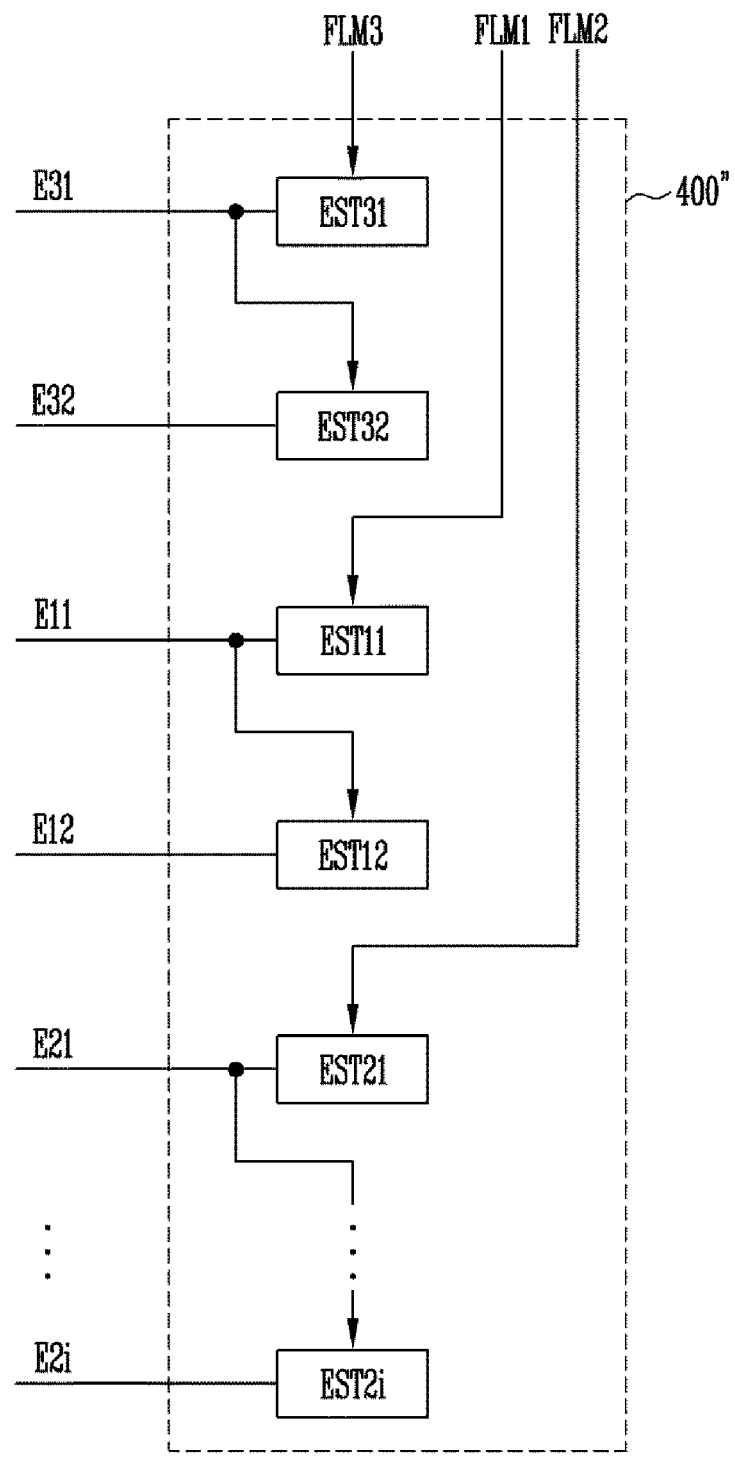
FIG. 19 illustrates an example of a light emission driver of FIG. 18.

FIG. 19 illustrates an example of a light emission driver of FIG. 18.

Referring to FIG. 19, the light emission driver 400" according to the example of the present disclosure includes the first light emission stages EST11 and EST12, the second light emission stages EST21 to EST2$i$, and third light emission stages EST31 and EST32.

The first light emission stages EST11 and EST12 are respectively connected to the first light emission control lines E11 and E12. The first light emission stages EST11 and EST12 are driven by the first start signal FLM1.

The second light emission stages EST21 to EST2$i$ are electrically connected to the second light emission control lines E21 to E2i, respectively. The second light emission stages EST21 to EST2i are driven in response to the second start signal FLM2.

The third light emission stages EST31 and EST32 are electrically connected to the third light emission control lines E31 and E32, respectively. The third light emission stages EST31 and EST32 are driven by a third start signal FLM3.

If the IR light source 130 is not driven, the timing controller 500 sequentially supplies the third start signal FLM3, the first start signal FLM1, and the second start signal FLM2 such that the light emission control signals are sequentially supplied to the third light emission control lines E31 and E32, the first light emission control lines E11 and E12, and the second light emission control lines E21 to E2j. At this time, the first start signal FLM1 to the third start signal FLM3 may be set to have the second width W2.

If the IR light source 130 is driven, the timing controller 500 sequentially supplies the third start signal FLM3, the first start signal FLM1, and the second start signal FLM2 such that the light emission control signals are sequentially supplied to the third light emission control lines E31 and E32, the first light emission control lines E11 and E12, and the second light emission control lines E21 to E2j. At this time, the third start signal FLM3 and the second start signal FLM2 may be set to have the second width W2, and the first start signal FLM1 may set to have the third width W3.

Figure 20:
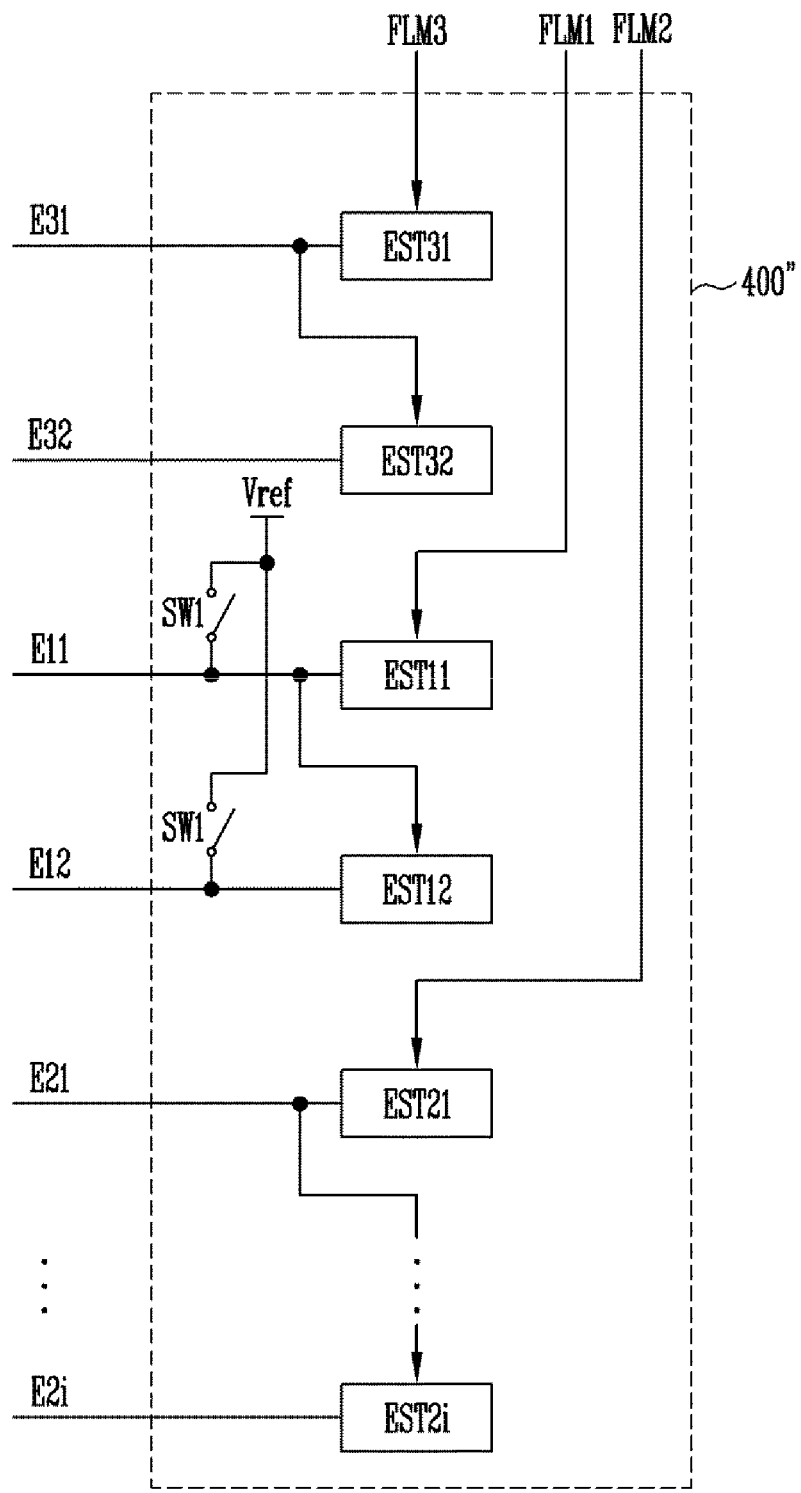
FIG. 20 illustrates another example of the light emission driver of FIG. 18.
Figure 21:
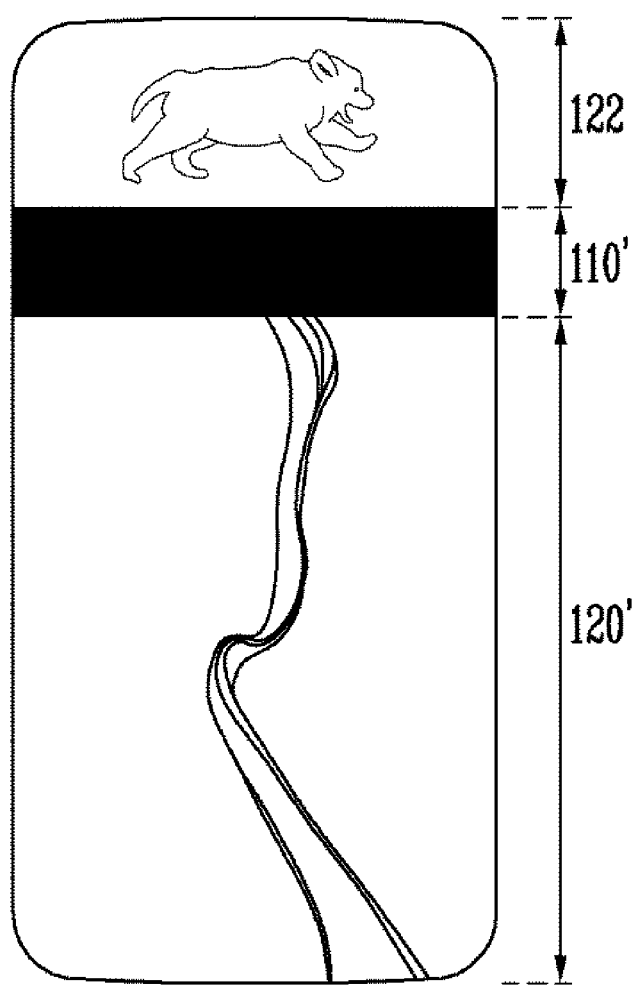
FIG. 21 illustrates still another image being displayed on the display device when the IR light source is driven.

FIG. 20 illustrates another example of the light emission driver of FIG. 18. Referring to FIG. 21, the light emission driver 400″ according to another example of the present disclosure includes the first light emission stages EST11 and EST12, the second light emission stages EST21 to EST2i, and third light emission stages EST31 and EST32.

The first light emission stages EST11 and EST12 are respectively connected to the first light emission control lines E11 and E12. The first light emission stages EST11 and EST12 are driven by the first start signal FLM1.

The second light emission stages EST21 to EST2i are electrically connected to the second light emission control lines E21 to E2i, respectively. The second light emission stages EST21 to EST2i are driven in response to the second start signal FLM2.

The third light emission stages EST31 and EST32 are electrically connected to the third light emission control lines E31 and E32, respectively. The third light emission stages EST31 and EST32 are driven by a third start signal FLM3.

If the IR light source 130 is not driven, the timing controller 500 sequentially supplies the third start signal FLM3, the first start signal FLM1, and the second start signal FLM2 such that the light emission control signals are sequentially supplied to the third light emission control lines E31 and E32, the first light emission control lines E11 and E12, and the second light emission control lines E21 to E2j. At this time, the first start signal FLM1 to the third start signal FLM3 may be set to have the second width W2.

If the IR light source 130 is driven, the timing controller 500 sequentially supplies the third start signal FLM3 and the second start signal FLM2 such that the light emission control signals are sequentially supplied to the third light emission control lines E31 and E32 and the second light emission control lines E21 to E2j. At this time, the third start signal FLM3 and the second start signal FLM2 may be set to have the second width W2.

Meanwhile, the light emission driver 400″ according to another example of the present disclosure further includes first switches SW1 which are connected between each of the first light emission control lines E11 and E12 and the reference power supply Vref.

The first switches SW1 are turned on or turned off in response to control of the timing controller 500. The first switches SW1 are set to be turned on during the period when the IR light source 130 is driven. If the first switches SW1 are turned on, a voltage of the reference power supply Vref is supplied to the first light emission control lines E11 and E12. If the voltage of the reference power supply Vref is supplied to the first light emission control lines E11 and E12, the light emission control transistors ME included in the first pixels PXL1 are set to be turned off, and thereby, the first pixels PXL1 are set to be in a non-emission state. The first switches SW1 may be turned on during the period of one frame 1F or the first period T1 of the period of one frame 1F.

FIG. 21 illustrates an image being displayed on the display device when the IR light source is driven during the period of one frame.

Referring to FIG. 21, the IR light source 130 is driven when a sensor included in the IR light source 130 operates. If the IR light source 130 is driven, the first pixels PXL1 included in the first display area 110' are set to be in the non-emission state. In addition, the second pixels PXL2 disposed in the second display area 120' and the third pixels PXL3 disposed in the third display area 122 display a predetermined image in response to the data signals regardless of the IR light source 130.

If the first pixels PXL1 are set to be in the non-emission state, it is possible to prevent an abnormal light emission phenomenon from occurring in the first display area 110' when the IR light source 130 is driven. That is, in the present embodiment of the present disclosure, when the IR light source 130 is driven, the first display area 110' is set to be in the non-emission state, and thus, display quality may be improved.

The technical spirit of the present disclosure is specifically described according to the preferred embodiments, but it should be noted that the aforementioned embodiments are just for explanation and are not intended to limit the present disclosure. In addition, it will be understood to those skilled in the art of the present inventive concept that various modifications can be made within the scope of the present disclosure.

The scope of the aforementioned disclosure is determined by the following Claims and is not restricted to the description of the specification, and modification and variation belonging to the equivalent range of the scope of Claims are all within the scope of the present disclosure.

What is claimed is:

1. A display device comprising:
   a first display area including first pixels;
   a second display area including second pixels; and
   an infrared (IR) light source overlapping the first pixels and positioned beyond the second display area in a plan view of the display device,
   wherein the first pixels are set to be in a non-emission state and the second pixels are set to be in an emission state to display an image when the IR light source is driven.

2. The display device according to claim 1, wherein the second pixels are driven in response to a data signal during a period when the IR light source is driven.

3. The display device according to claim 1, wherein the IR light source is driven during a period of one frame, and the first pixels are set to be in the non-emission state during the period of the one frame.

4. The display device according to claim 1, wherein the IR light source is driven during a first period which is a part of a period of one frame, and is not driven during a second period which is a remaining period of the one frame.

5. The display device according to claim 4, wherein the first pixels are set to be in the non-emission state during the first period, and are driven in response to a data signal during the second period.

6. The display device according to claim 1, wherein the IR light source is included in a proximity sensor or fingerprint sensor.

7. The display device according to claim 1, wherein the first display area is on an upper side or lower side of a panel.

8. The display device according to claim 1, further comprising:
   a scan driver configured to drive scan lines which are disposed in the first display area and the second display area;
   a light emission driver configured to drive first light emission control lines which are disposed in the first display area and second light emission control lines which are disposed in the second display area; and
   a data driver configured to drive data lines which are disposed in the first display area and the second display area.

9. The display device according to claim 8,
   wherein the light emission driver includes first light emission stages which are respectively connected to the first light emission control lines and includes second light emission stages which are respectively connected to the second light emission control lines,
   wherein the first light emission stages are driven in response to a first start signal, and
   wherein the second light emission stages are driven in response to a second start signal.

10. The display device according to claim 9, wherein a width of the first start signal is set to be different from a width of the second start signal during a period when the IR light source is driven.

11. The display device according to claim 9, wherein the first start signal has a width greater than the second start signal during a period when the IR light source is driven.

12. The display device according to claim 9, wherein the first start signal is set to have a same width as the second start signal during a period when the IR light source is not driven.

13. The display device according to claim 9, further comprising:
   first switches disposed between each of the first light emission control lines and a reference power supply.

14. The display device according to claim 13, wherein the reference power supply is set to have a gate-off voltage such that transistors included in the first pixels are turned off.

15. The display device according to claim 13, wherein the first switches are turned on and a voltage of the reference power supply is supplied to the first light emission control lines during a period when the IR light source is driven.

16. The display device according to claim 15, wherein the first start signal is not supplied during the period when the IR light source is driven.

17. The display device according to claim 8, wherein each of first pixels includes:
   an organic light emitting diode;
   a driving transistor configured to control the amount of current which is supplied to a current path from a first power supply to a second power supply through the organic light emitting diode in response to a data signal; and
   at least one light emission control transistor disposed in the current path and comprising a gate electrode which is connected to one of the first light emission control lines.

18. The display device according to claim 17, wherein the light emission control transistor is disposed between the first power supply and the driving transistor.

19. The display device according to claim 17, wherein the light emission control transistor is disposed between the driving transistor and the second power supply.

20. The display device according to claim 17, wherein the light emission control transistor includes:
   a first light emission control transistor disposed between the first power supply and the driving transistor; and
   a second light emission control transistor disposed between the driving transistor and the second power supply.

21. The display device according to claim 1, further comprising:
   a third display area including third pixels.

22. The display device according to claim 21, wherein the first display area is disposed between the second display area and the third display area.

23. The display device according to claim 21, wherein the second pixels and the third pixels are set to be in the emission state during a period when the IR light source is driven.

24. The display device according to claim 21, further comprising:
   a scan driver configured to drive scan lines which are disposed in the first display area, the second display area, and the third display area;
   a light emission driver configured to drive first light emission control lines which are disposed in the first display area, second light emission control lines which are disposed in the second display area, and third light emission control lines which are disposed in the third display area; and
   a data driver configured to drive data lines which are disposed in the first display area, the second display area, and the third display area.

25. The display device according to claim 24, wherein the light emission driver includes:
   first light emission stages respectively connected to the first light emission control lines and configured to be driven in response to a first start signal;
   second light emission stages respectively connected to the second light emission control lines and configured to be driven in response to a second start signal; and
   third light emission stages respectively connected to the third light emission control lines and configured to be driven in response to a third start signal.

26. The display device according to claim 25, wherein a width of the first start signal is set to be different from widths of the second start signal and the third start signal during a period when the IR light source is driven.

27. The display device according to claim 26, wherein the width of the first start signal is set to be greater than the widths of the second start signal and the third start signal.

28. The display device according to claim 25, wherein widths of the first start signal, the second start signal, and the third start signal are set to be the same during a period when the IR light source is not driven.

29. A display device comprising:
- a panel including display areas, the display areas including a first display area and a second display area, the first display area including first pixels, the second display area including second pixels;
- an IR light source surrounded by the first pixels and positioned beyond the second display area in a plan view of the display device;
- light emission control lines formed in the display areas so as to control light emission and non-emission of the first pixels and the second pixels; and
- a light emission driver configured to receive start signals and to supply a light emission control signal to the light emission control lines in response to the start signals,
- wherein the first pixels are set to be in a non-emission state and the second pixels are set to be in an emission state to display an image when the IR light source is driven.

30. The display device according to claim 29, wherein the IR light source is driven during a period of one frame, and the first pixels are set to be in the non-emission state during the period of the one frame.

31. The display device according to claim 29, wherein the IR light source is driven during a first period which is a part of a period of one frame, and is not driven during a second period which is a remaining period of the one frame.

32. The display device according to claim 31, wherein the first pixels are set to be in the non-emission state during the first period, and are driven in response to a data signal during the second period.

33. The display device according to claim 29, further comprising:
- a timing controller configured to supply the start signals to the light emission driver.

34. The display device according to claim 33, wherein the timing controller supplies a first start signal with a first width to the first display area, and supplies a second start signal with a second width different from the first width to other areas other than the first display area, during a period when the IR light source is driven.

35. The display device according to claim 34, wherein the first width is set to be greater than the second width.

36. The display device according to claim 29, wherein each of the first pixels includes:
- an organic light emitting diode;
- a driving transistor configured to control the amount of current which is supplied to a current path from a first power supply to a second power supply through the organic light emitting diode in response to a data signal; and
- at least one light emission control transistor disposed in the current path, comprising a gate electrode which is connected to one of the light emission control lines, and configured to be turned off when the light emission control signal is supplied.

37. The display device according to claim 36, wherein the light emission control transistor is disposed between the first power supply and the driving transistor.

38. The display device according to claim 36, wherein the light emission control transistor is disposed between the driving transistor and the second power supply.

39. The display device according to claim 36, wherein the light emission control transistor includes:
- a first light emission control transistor disposed between the first power supply and the driving transistor; and
- a second light emission control transistor disposed between the driving transistor and the second power supply.

40. A driving method of a display device, the display device including a first display area, a second display area, and an IR light source, the first display area including first pixels, the second display area including second pixels, the method comprising:
- setting the plurality of first pixels to be in a non-emission state and setting the second pixels to be in an emission state during a period when the IR light source is driven, wherein the IR light source overlaps the first pixels and is positioned beyond the second display area in a plan view of the display device.

41. The driving method of a display device according to claim 40, wherein the first pixels and the second pixels are driven in response to a data signal during a period when the IR light source is not driven.

42. A display device comprising:
- a first display area including first pixels connected to a scan line;
- a second display area including second pixels connected to scan lines;
- an IR light source overlapping the first pixels and positioned beyond the second display area in a plan view of the display device; and
- a light emission driver including a first light emission stage which receives a first start signal and including a second light emission stage which receives a second start signal,
- wherein the first pixels do not emit light and the second pixels emit light to display an image when the IR light source is driven.

43. The display device according to claim 42, wherein the first start signal and the second start signal have different widths when the IR light source is driven.

44. The display device according to claim 43, wherein the first start signal has a width greater than that of the second start signal when the IR light source is driven.

45. The display device according to claim 42, further comprising a third display area including third pixels, the first display area being disposed between the second display area and the third display area,
- wherein the light emission driver further includes a third light emission stage which receives a third start signal, and
- wherein a width of the first start signal is different from widths of the second start signal and the third start signal when the IR light source is driven.

46. The display device according to claim 42, wherein the first light emission stage is connected to a first light emission control line, and
- wherein the first light emission control line receives a reference power supply when the IR light source is driven.

* * * * *